United States Patent
Lin et al.

(10) Patent No.: US 11,989,496 B2
(45) Date of Patent: May 21, 2024

(54) METHOD AND STRUCTURE FOR MANDREL PATTERNING

(71) Applicant: Taiwan Semiconductor Manufacturing Company, Ltd., Hsin-Chu (TW)

(72) Inventors: Chun-Yen Lin, Hsinchu (TW); Tung-Heng Hsieh, Hsinchu County (TW); Bao-Ru Young, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 404 days.

(21) Appl. No.: 17/406,781

(22) Filed: Aug. 19, 2021

(65) Prior Publication Data

US 2023/0057293 A1 Feb. 23, 2023

(51) Int. Cl.
*G06F 30/392* (2020.01)
*G06F 30/33* (2020.01)
*G06F 30/398* (2020.01)

(52) U.S. Cl.
CPC ............ *G06F 30/392* (2020.01); *G06F 30/33* (2020.01); *G06F 30/398* (2020.01)

(58) Field of Classification Search
CPC ...... G06F 30/392; G06F 30/33; G06F 30/398; G06F 30/394; H01L 21/0334; H01L 27/0207

USPC ......................................................... 716/111
See application file for complete search history.

(56) References Cited

U.S. PATENT DOCUMENTS

| | | | |
|---|---|---|---|
| 9,946,827 B2 | 4/2018 | Wang et al. | |
| 2012/0278781 A1 | 11/2012 | Wann et al. | |
| 2017/0017745 A1 | 1/2017 | Wang et al. | |
| 2019/0064652 A1 | 2/2019 | Wang et al. | |
| 2019/0131139 A1* | 5/2019 | Oh | G06F 30/392 |
| 2020/0006149 A1 | 1/2020 | Liaw | |

* cited by examiner

*Primary Examiner* — Paul Dinh
(74) *Attorney, Agent, or Firm* — Haynes and Boone, LLP

(57) ABSTRACT

A method includes receiving an integrated circuit (IC) design layout including a layout block, where the layout block including first line patterns disposed along a first direction, extending lengths of the first line patterns, connecting portions of the first line patterns disposed within a distance less than a preset value, forming second line patterns disposed outside the layout block parallel to the first line patterns, forming mandrel bar patterns overlapping edges of the layout block, where the mandrel bar patterns oriented along a second direction perpendicular to the first direction, and outputting a pattern layout for mask fabricating, where the pattern layout includes the layout block, the first and second line patterns, and the mandrel bar patterns.

20 Claims, 24 Drawing Sheets

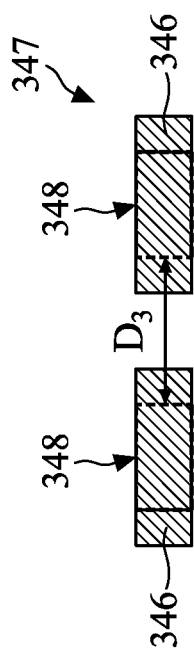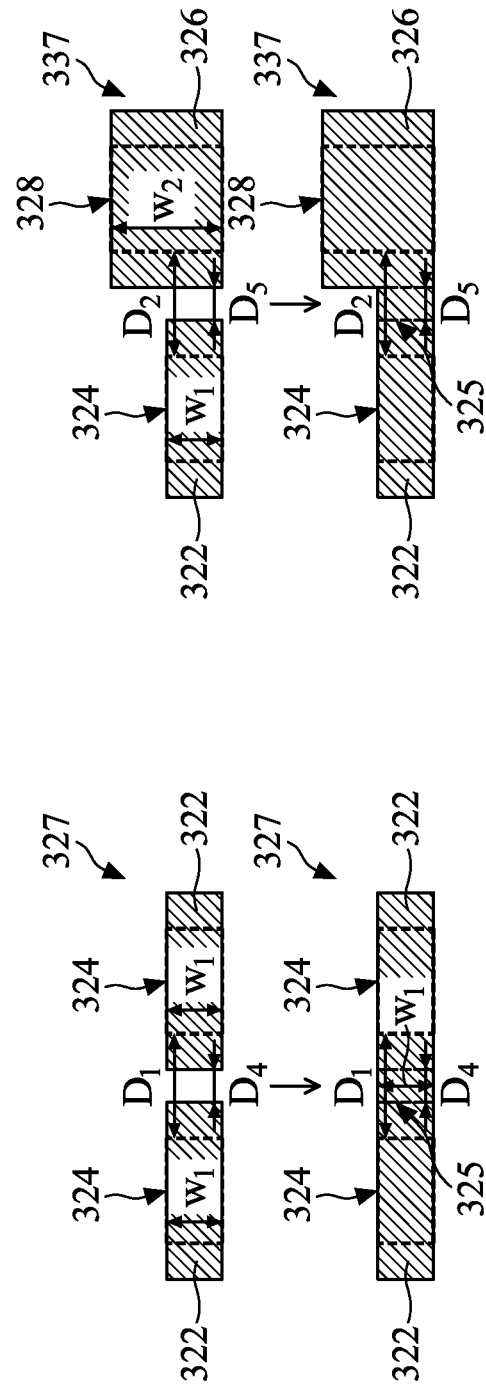
FIG. 6C
FIG. 6B
FIG. 6A

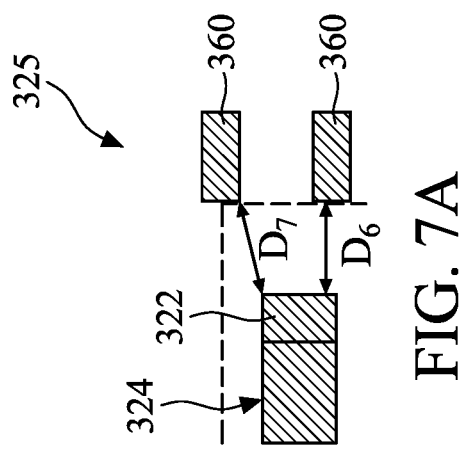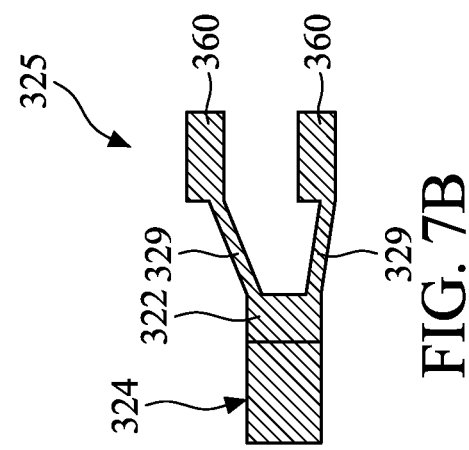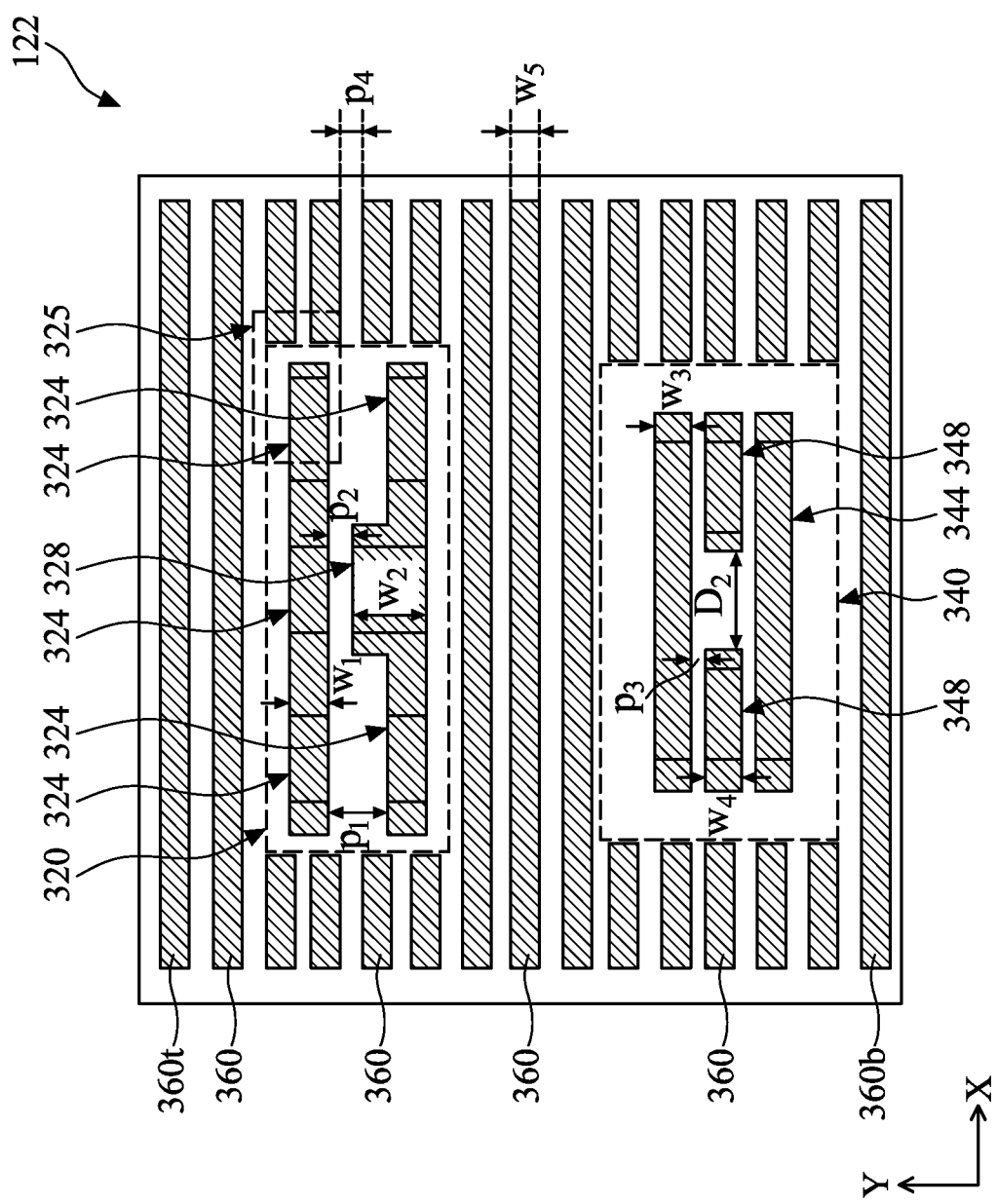

METHOD AND STRUCTURE FOR MANDREL PATTERNING

BACKGROUND

As integrated circuit (IC) technologies are continually progressing to smaller technology nodes, such as a 32 nm technology node and below, simply scaling down similar designs used at larger nodes often results in inaccurate or poorly shaped device features due to the resolution limit of conventional optical lithography technology. Examples of inaccurate or poorly shaped device features include rounding, pinching, necking, bridging, dishing, erosion, metal line thickness variations, and other characteristics that affect device performance. One approach to improving image printing quality on a wafer is to use restrictive design rules (RDR) in IC layout designs. An example IC layout according to RDR includes parallel line patterns extending in the same direction and spaced by a line pitch. The line width and line pitch are designed so as to improve image printing quality by utilizing constructive light interference.

However, in a large-scale IC, not all patterns are designed according to the same design rules. For example, an IC may include both logic circuits and embedded static random-access memory (SRAM) cells. The SRAM cells may use smaller line pitches for area reduction, while the logic circuits may use larger line pitches. For another example, an IC may include multiple off-the-shelf macros, each of which has been laid out according to its own set of RDRs. In such ICs, multiple layout blocks may be used. Each layout block is designed according to a set of RDRs and different layout blocks may use different RDRs. Regions between any two layout blocks are provided to accommodate printing inaccuracy such as line end rounding, as well as to meet certain spacing requirements for IC manufacturing. These regions become a concern when greater device integration is desired.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 5, 6, 6A, 6B, 6C, 7, 7A, 7B, 8, 9, 9A, 9B, 9C, and 9D illustrate modified IC design layouts according to the method shown in FIG. 3, according to various aspects of the present disclosure.

DETAILED DESCRIPTION

Figure 1:
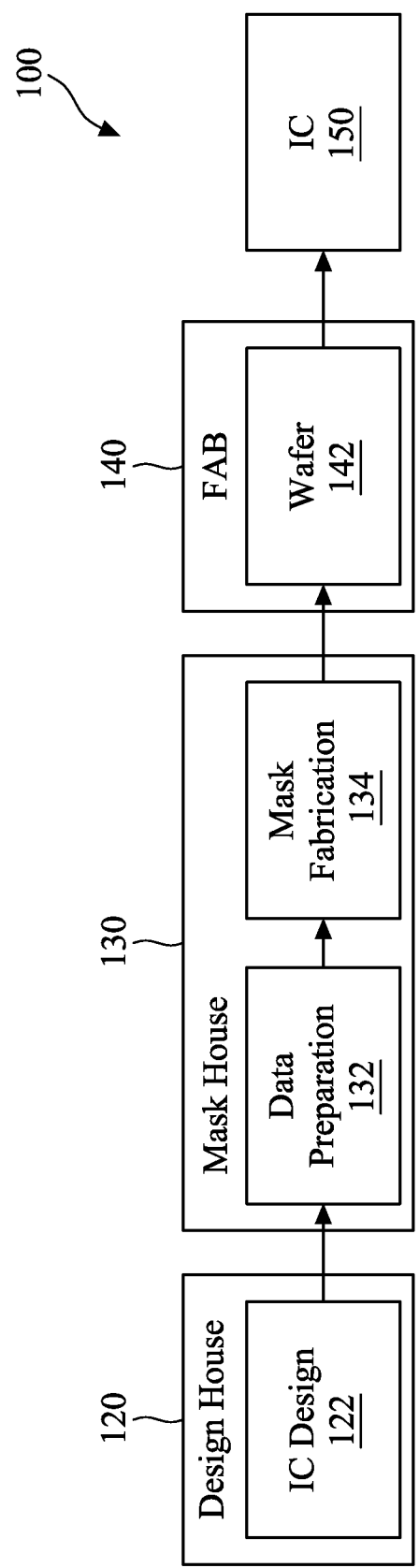
FIG. 1 is a simplified block diagram of an embodiment of an integrated circuit (IC) manufacturing system and an associated IC manufacturing flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a simplified block diagram of an embodiment of an IC manufacturing system 100 and an IC manufacturing flow associated therewith, which may benefit from various aspects of the provided subject matter. The IC manufacturing system 100 includes a plurality of entities, such as a design house 120, a mask house 130, and an IC manufacturer 140 (i.e., a fab), that interact with one another in the design, development, and manufacturing cycles and/or services related to manufacturing an IC 150. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 140 may be owned by a single larger company, and may even coexist in a common facility and use common resources.

Figure 4:
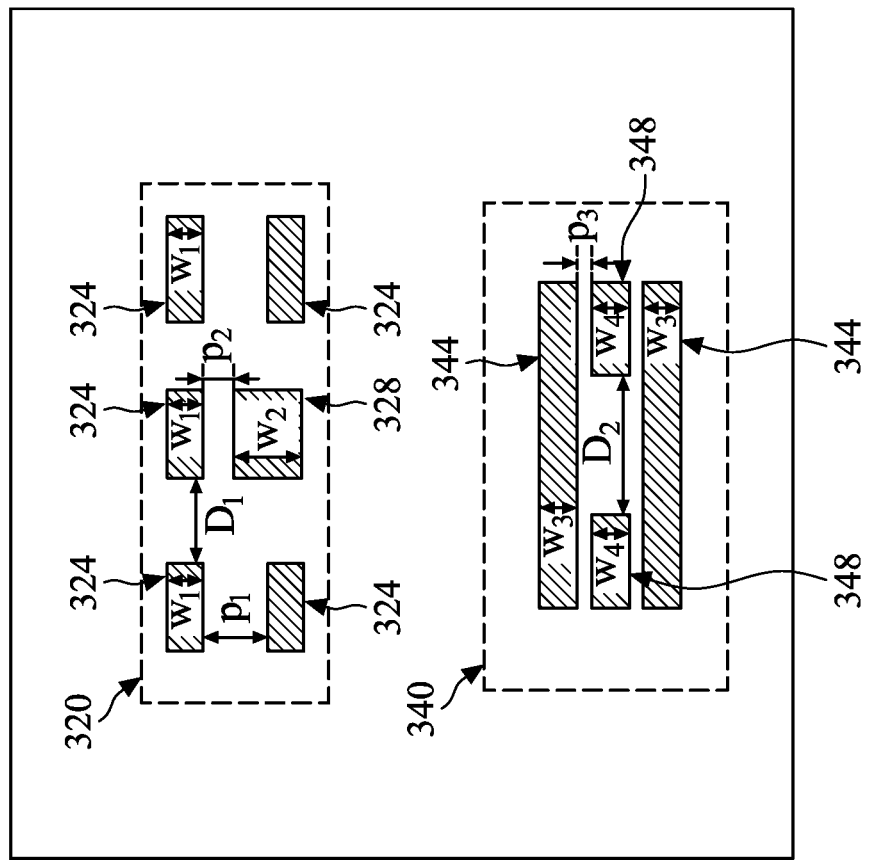
FIG. 4 illustrates an IC layout having two layout blocks according to various aspects of the present disclosure.

The design house (or design team) 120 generates an IC design layout 122. The IC design layout 122 includes various geometrical patterns designed for the IC 150. An example IC design layout 122 is shown in FIG. 4, which includes two layout blocks 320 and 340. The two layout blocks 320 and 340 each include a plurality of device patterns 324, 328, 344 and 348 respectively, designed according to some RDRs. Particularly, the device patterns 324, 328, 344 and 348 are line patterns oriented lengthwise along the X direction.

The various geometrical patterns in the IC design layout 122, such as the device patterns 324, 328, 344 and 348, may correspond to patterns of metal, oxide, or semiconductor layers that make up various components of the IC 150 to be fabricated. The various components may include active regions, gate electrodes, metal lines or vias of an interlayer interconnection, and openings for bonding pads, which are to be formed in a semiconductor substrate (such as a silicon wafer) and various material layers disposed on the semiconductor substrate. In an embodiment, the device patterns 324, 328, 344 and 348 are transferred to a mandrel structure used in a patterning process for IC 150 fabrication. In some embodiments, dummy patterns are added outside the layout blocks 320 and 340 to improve pattern density, which will be described in more details later. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format, a DFII file format, or another suitable computer-readable data format.

The mask house 130 uses the IC design layout 122 to manufacture one or more masks to be used for fabricating various layers of the IC 150. The mask house 130 performs mask data preparation 132, mask fabrication 134, and other suitable tasks. The mask data preparation 132 translates the IC design layout 122 into a form that can be physically written by a mask writer. The mask fabrication 134 then fabricates a plurality of masks that are used for patterning a substrate (e.g., a wafer). In the present embodiment, the mask data preparation 132 and mask fabrication 134 are illustrated as separate elements. However, the mask data preparation 132 and mask fabrication 134 can be collectively referred to as mask data preparation.

In the present embodiment, the mask data preparation 132 prepares a mandrel pattern layout and a cut pattern layout to be used in a patterning process. The preparation of the mandrel pattern includes extending the device patterns (e.g., in the operation 204), connecting adjacent device patterns under certain rules (e.g., operation 206), inserting dummy patterns (e.g., dummy line patterns) outside the layout blocks 320 and 340 (FIG. 7) to improve pattern density and device density (e.g., in the operation 208); and adding mandrel bar patterns to connect the device patterns and adjacent dummy patterns (e.g., in the operation 210). The mandrel pattern layout defines a mandrel pattern in a first exposure and the cut pattern layout defines a cut pattern in a second exposure. The cut pattern removes unwanted portions of the mandrel pattern, a derivative, or both. The final pattern includes the mandrel pattern plus the derivative but not the cut pattern.

The mask data preparation 132 may further include optical proximity correction (OPC) which uses lithography enhancement techniques to compensate for image errors, such as those that can arise from diffraction, interference, or other process effects. The mask data preparation 132 may further include a mask rule checker (MRC) that checks the IC design layout with a set of mask creation rules which may contain certain geometric and connectivity restrictions to ensure sufficient margins, to account for variability in semiconductor manufacturing processes, etc. In an embodiment, portions of the device patterns 324 and 328 are connected according to the MRC in the operation 206. In another embodiment, mandrel bar patterns 380 are included according to the MRC. The mask data preparation 132 may further include lithography process checking (LPC) that simulates processing that will be implemented by the IC manufacturer 140 to fabricate the IC 150. The processing parameters may include parameters associated with various processes of the IC manufacturing cycle, parameters associated with tools used for manufacturing the IC, and/or other aspects of the manufacturing process.

It should be understood that the above description of the mask data preparation 132 has been simplified for the purposes of clarity, and data preparation may include additional features such as a logic operation (LOP) to modify the IC design layout according to manufacturing rules. Additionally, the processes applied to the IC design layout 122 during mask data preparation 132 may be executed in a variety of different orders.

After mask data preparation 132 and during mask fabrication 134, a mask or a group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies such as a transmissive mask or a reflective mask. In an embodiment, the mask is formed using binary technology, where a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM.

The IC manufacturer 140, such as a semiconductor foundry, uses the mask (or masks) fabricated by the mask house 130 to fabricate the IC 150. The IC manufacturer 140 is an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer 142 is fabricated using the mask (or masks) to form the IC 150. The semiconductor wafer 142 includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, and/or other suitable processes.

Figure 2:
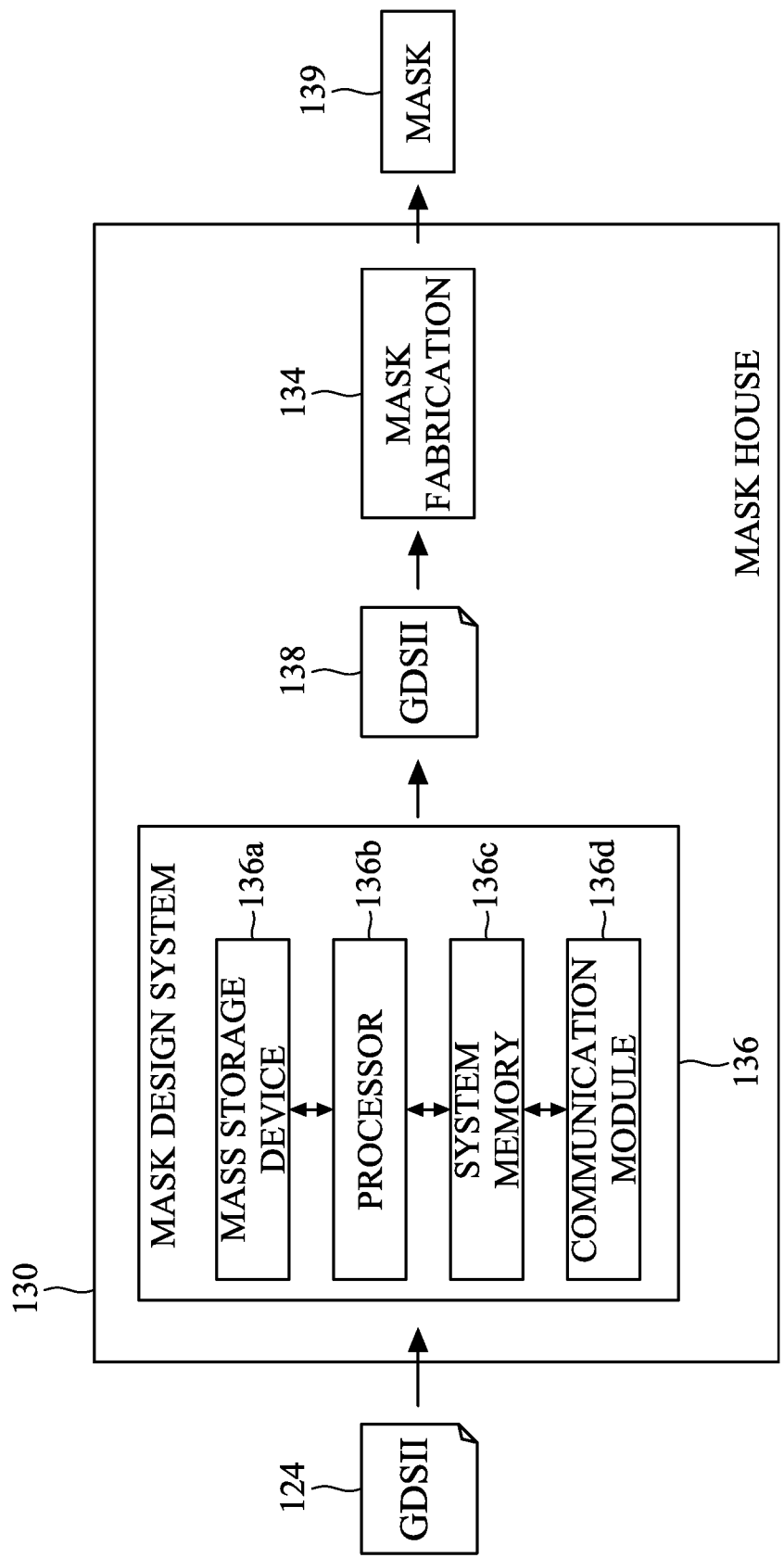
FIG. 2 is a more detailed block diagram of the mask house shown in FIG. 1 according to various aspects of the present disclosure.

FIG. 2 is a more detailed block diagram of the mask house 130 shown in FIG. 1 according to various aspects of the present disclosure. In the illustrated embodiment, the mask house 130 includes a mask design system 136 that is tailored to perform the functionality described in association with mask data preparation 132 of FIG. 1. The mask design system 136 is an information handling system such as a computer, server, workstation, or other suitable device. The mask design system 136 includes a processor 136b that is communicatively coupled to a system memory 136c, a mass storage device 136a, and a communication module 136d. The system memory 136c provides the processor 136b with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 136a. Examples of mass storage devices may include hard drives, optical drives, magneto-optical drives, solid-state storage devices, and/or a variety of other mass storage devices known in the art. The communication module 136d is operable to communicate information such as IC design layout files with the other components in the IC manufacturing system 100, such as the design house 120. Examples of communication modules may include Ethernet cards, 802.11 WiFi devices, cellular data radios, and/or other suitable devices.

In operation, the mask design system 136 is configured to manipulate the IC design layout 122 before it is transferred to a mask 139 by the mask fabrication 134. In an embodiment, the mask data preparation 132 in FIG. 1 is implemented as software instructions executing on the mask design system 136 in FIG. 2. To further this embodiment, the mask design system 136 receives a first GDSII file 124 containing the IC design layout 122 from the design house 120, and modifies the IC design layout 122, for example, to extend the device patterns, to insert dummy patterns, to connect device patterns under MRC, to insert mandrel bar patterns, and to perform other manufacturability enhancement. After the mask data preparation 132 is complete, the mask design system 136 transmits a second GDSII file 138 containing a modified IC design layout to the mask fabrication 134. In alternative embodiments, the IC design layouts 122 and 138 may be transmitted between the components in IC manufacturing system 100 in alternate file formats such as DFII, CIF, OASIS, or any other suitable file type. Further, the mask design system 136 and the mask house 130 may include additional and/or different components in alternative embodiments.

Figure 3:
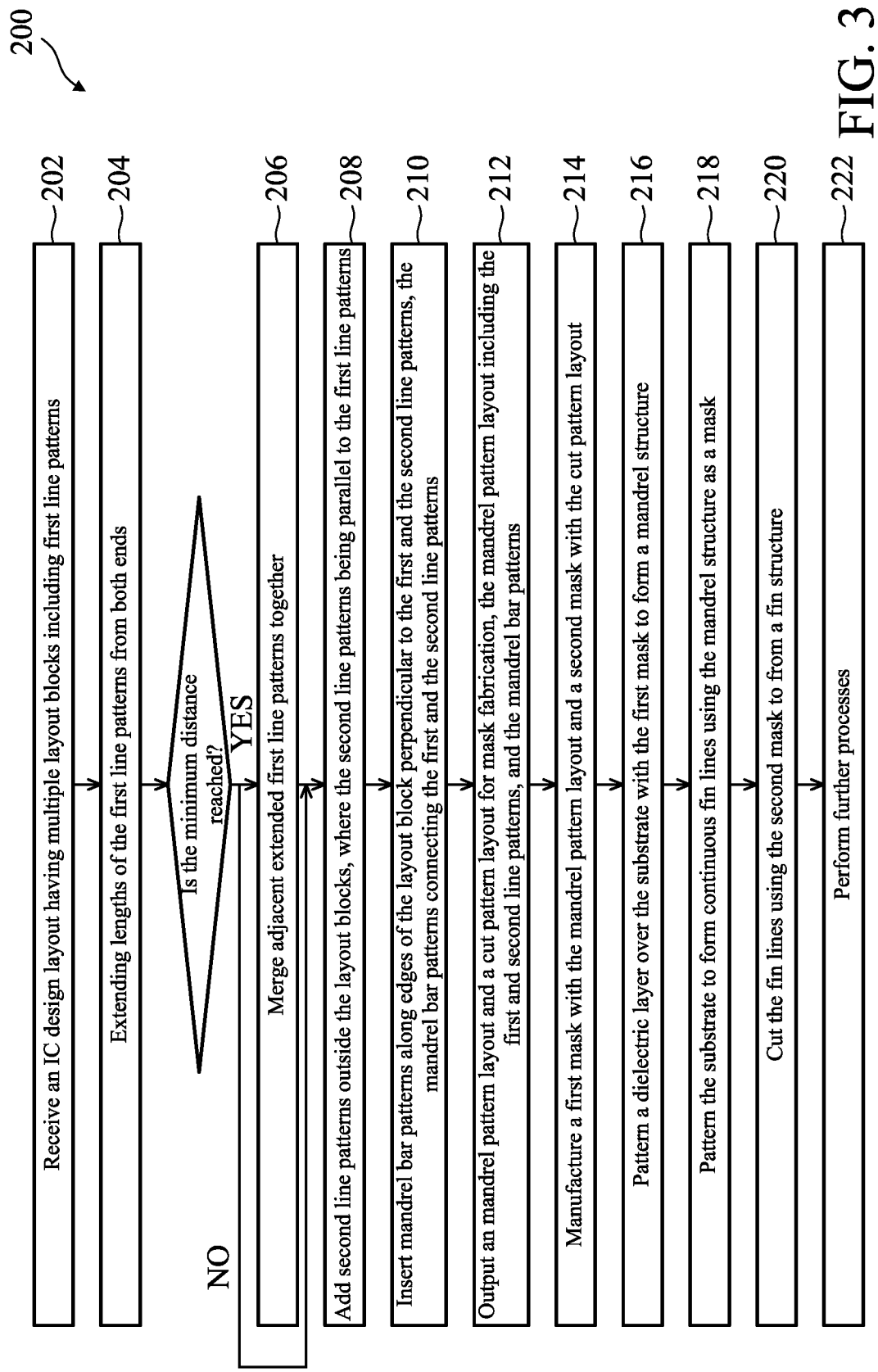
FIG. 3 shows a flowchart of a method of manufacturing an IC according to various aspects of the present disclosure.

FIG. 3 is a high-level flowchart of a method 200 of manufacturing the IC 150 according to various aspects of the present disclosure. In a brief overview, the method 200 includes operations 202, 204, 206, 208, 210, 212, 214, 216, 218, 220, and 222. The operation 202 receives an IC design layout having multiple layout blocks separated by spaces outside the layout blocks. The operation 204 modifies the IC design layout by extending the device patterns (e.g., line patterns) inside the layout blocks to form extended device patterns. The method 200 then measures the distance of the adjacent device patterns and merge them together at operation 206 if the distance is less than a preset minimum value. If the distance between the adjacent device patterns are greater than the preset minimum value, the method 200 skips the operation 206 and proceeds to the operation 208 directly. The operation 208 forms dummy patterns (e.g., line patterns) in the space outside the layout blocks. The operation 210 inserts mandrel bars between the device patterns and the dummy patterns, thereby connecting the device patterns to adjacent dummy patterns. The operation 212 outputs a mandrel pattern layout and a cut pattern layout for mask fabrication. The operation 214 fabricates a first mask with the mandrel pattern layout and a second mask with the cut pattern layout. The operation 216 patterns the IC substrate with the first mask to form a mandrel structure. The operation 218 transfers the mandrel patterns into the IC substrate using the mandrel structure as a mask. Thereafter, the operation 220 performs a cutting process to remove unwanted portions of the mandrel structure to form a fin structure. The method 200 then performs additional processes necessary to form the IC 150.

The method 200 may be implemented in the various components of the IC manufacturing system 100. For example, the operations 202, 204, 206, 208, 210 and 212 may be implemented in the mask data preparation 132 of the mask house 130; the operation 214 may be implemented in the mask fabrication 134 of the mask house 130; and the operations 218, 220, and 222 may be implemented in the IC manufacturer 140. The method 200 is merely an example for illustrating various aspects of the provided subject matter. Additional operations can be provided before, during, and after the method 200, and some operations described can be replaced, eliminated, or moved around for additional embodiments of the method 200. The method 200 in FIG. 3 is a high-level overview and details associated with each operation therein will be described in association with the subsequent figures in the present disclosure.

At operation 202, referring to FIGS. 3 and 4, the method 200 receives the IC design layout 122. the IC design layout 122 includes various geometrical patterns (e.g., patterns corresponding to devices) for creating features of an IC. In the present embodiment, these geometrical patterns are confined in layout blocks, for example, layout blocks 320 and 340. The layout blocks may be any user defined shapes such as square, rectangle, oval, circle, and/or other regular or irregular shapes. The layout blocks may be uniform in size and/or evenly distributed across the substrate.

In the present embodiments, the IC design layout 122 includes two layout blocks 320 and 340 of different sizes separated from each other by spaces outside the layout blocks 320 and 340. Each of the layout blocks 320 and 340 is a rectangular region and includes patterns conforming to certain restricted design rules. Distances of the borders (or edges) of the layout blocks 320 and 340 from the device patterns inside are the minimum width that the mask fabricator can process. The layout blocks 320 and 340 are such designed to accommodate the later formed dummy patterns outside the layout blocks 320 and 340 to achieve required pattern density and device density. For example, the layout blocks 320 and 340 are separated to avoid uneven adjacent corners between two rectangular layout blocks of different sizes. These corners cause irregular empty spaces and requires to be filled with dummy patterns separately to improve pattern density. Among other benefits, the present disclosure resolves such issues and simplifies the dummy pattern layout. For example, the dummy patterns outside the layout blocks 320 and 340 may use uniform line width and line pitch throughout the entire IC design layout 122 while still maintain desirable pattern density (e.g., about 30% to about 50%).

In the present embodiments, the layout block 320 includes the device patterns 324 and 328 having the line width $w_1$ and $w_2$. The distance between device patterns 324 along Y direction is line pitch $p_1$, and the distance between the device patterns 324 and the device patterns 328 along Y direction is $p_1$. Distances between the device patterns 324 and 328 along the X direction is a distance $D_1$. The layout block 340 includes the device patterns 344 and 348 having line width $w_3$ and $w_4$, respectively. The distances between the device patterns 344 and 348 along Y direction is line pitch $p_3$. Distance between device patterns 348 along X direction is a distance $D_2$. The line pitches $p_1$, $p_2$ and $p_1$ are defined as the distances between adjacent edges of the line patterns in the present embodiment. They may also be defined using edge-to-edge distance or center-line-to-center-line distance in alternative embodiments. The device patterns 324, 328, 344, and 348 are oriented lengthwise along the same direction (e.g., along the X direction), the line widths $w_1$, $w_2$, $w_3$, and $w_4$ may be the same or different, the distance $D_1$ and the distance $D_2$, and the line pitches $p_1$, $p_2$, and $p_3$ may be the same or different. In the present example, the line pitch $p_1$ is greater than the line pitch $p_2$, the distance $D_2$ is greater than the distance $D_1$, and the line width $w_3$ is greater than the line width $w_4$. It is noted that the device patterns in FIG. 4 are for illustration only and not intended to be limiting beyond what is specifically recited in the claims.

The layout blocks 320 and 340 are separate for various reasons. For example, they may include different design macros or different types of circuit elements (e.g., logic circuits and SRAM cells). For another example, they may be separated to avoid the corners formed between two different sized layout blocks if stacked together. In addition, the layout blocks 320 and 340 may be designed to have different line widths and pitches so as to avoid accidental linking between the two blocks. Further, the layout blocks 320 and 340 are shown in rectangular regions for the purpose of simplification and they may be in other shapes or other polygons in various embodiments. The layout blocks 320 and 340 are outlined in dotted lines for illustration purposes only, and the dotted lines are not part of the pattern layout.

In some embodiments, the device patterns 324, 328, 344, and 348 may be used for creating IC features such as active regions, source and drain features, gate electrodes, metal lines or vias, and openings for bonding pads. In the present embodiment, the device patterns 324, 328, 344, and 348 define a mandrel pattern that will be used for etching a substrate to form fins for fin field effect transistors (FinFETs).

In a typical design, due to the limitations of the conventional optical lithography technology, the ends of the line patterns (e.g., the device patterns 324, 328, 344, 348, and the dummy patterns 370) may become rounded after being printed on a wafer and thereby compromising device performances. The line patterns may be extended lengthwise to pattern a substrate (e.g., a wafer), the round endings of the resulting lines are cut (or shortened, trimmed) using a cut pattern to achieve intended length for the line patterns. However, if the extended line patterns (e.g., extended device patterns 322, 326, 342, 346, and extended dummy patterns 360) are too close to each other, the line ends may connect to each other accidentally in an uncontrolled manner after transferring to the substrate due to the limitations of the conventional optical lithography technology, thereby causing processing issues in subsequent processes. For example, the uncontrolled connections between the ends of the line patterns may break off and shift to other portions of the substrate, thereby causing inadvertent patterns between lines. Therefore, it is desirable to reduce or eliminate small spaces between the ends of the line patterns to improve design density and reducing manufacturing defects. The provided subject matter addresses this issue, among others.

Figure 5:
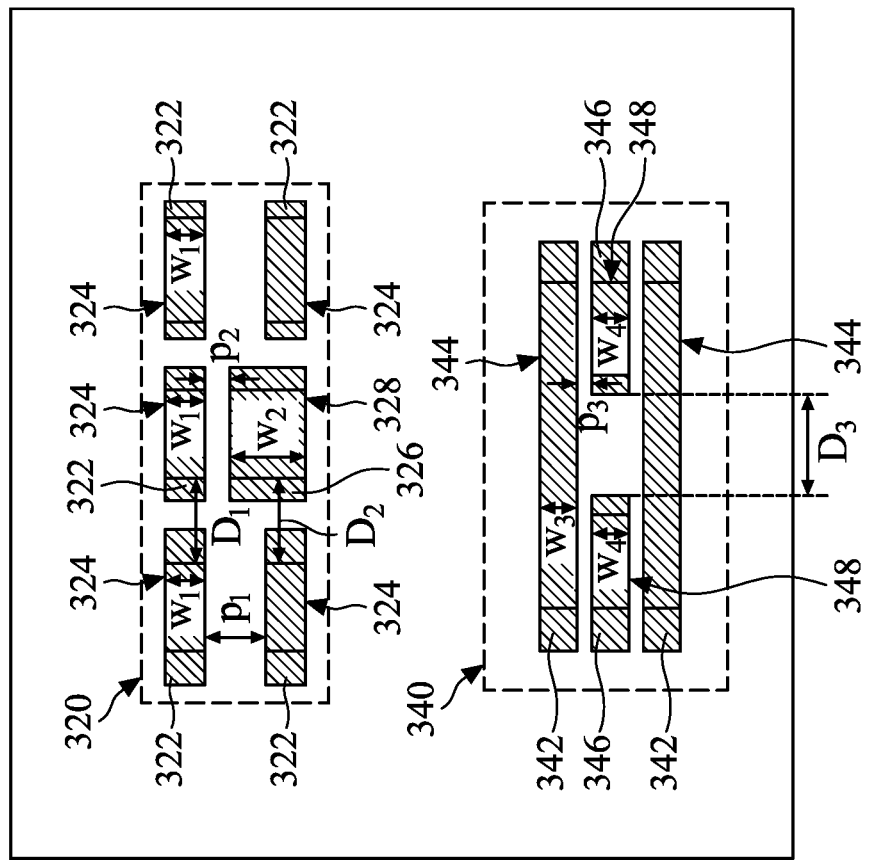

At operation 204, referring to FIGS. 3 and 5, the method 200 extends the lengths of the device patterns 324, 328, 344, and 348 in the layout blocks 320 and 340 to form extended device patterns 322, 326, 342, and 346. The extended lengths are such designed that rounding ends of the extended device patterns 322, 326, 342, and 346 after patterning are limited to the extended lengths, and the extended device patterns 322, 326, 342, and 346 after cutting the rounding ends are substantially the same as the device patterns 324, 328, 344, and 348. In the present embodiments, the extended device patterns 322, 326, 342, and 346 are separated from each other by distances less than the distances therebetween before extending.

Figure 6:
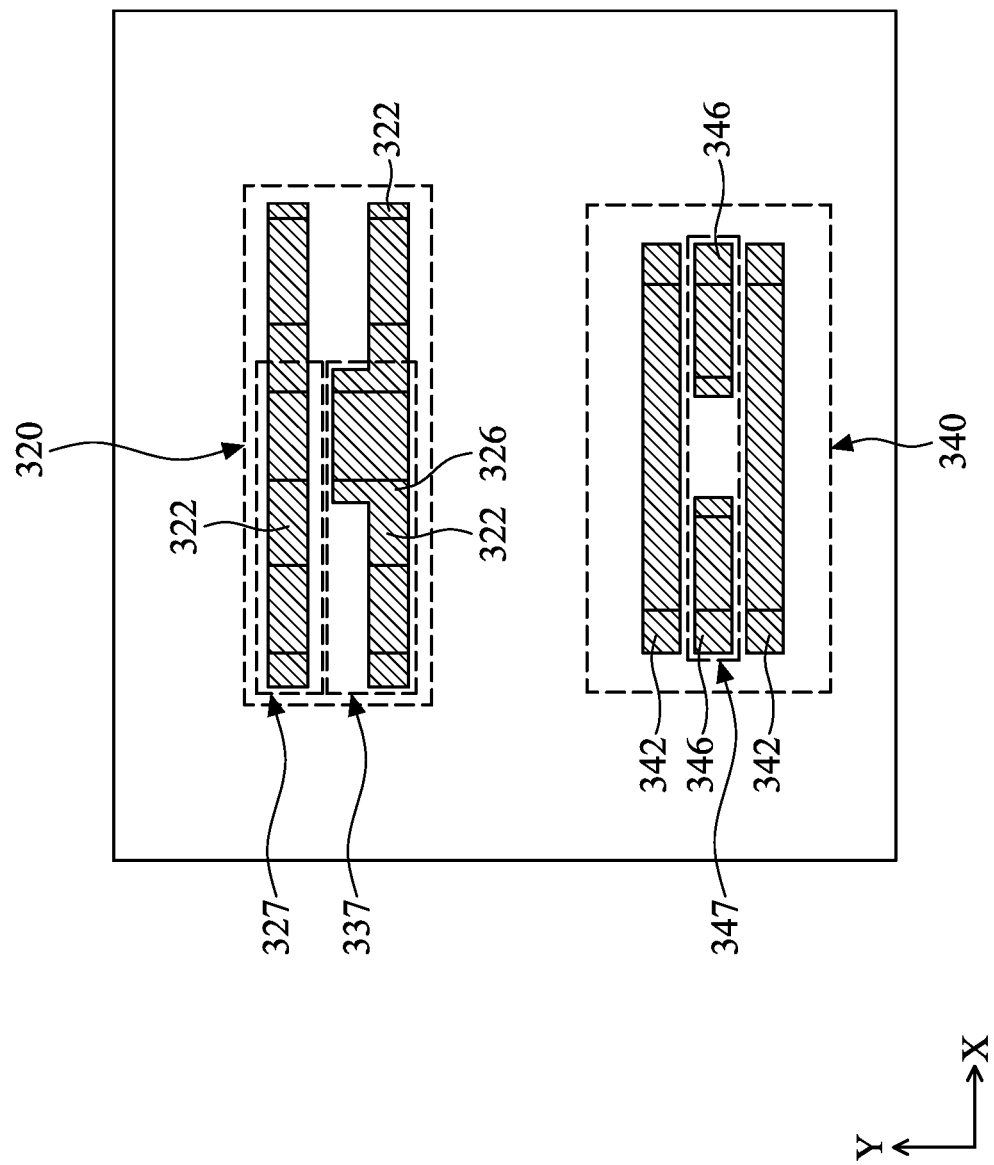

Referring to FIG. 6 and FIGS. 6A-6C, the method 200 evaluates the distances (e.g., the distances $D_1$, $D_2$ and $D_3$) between the ends of the device patterns 324, 328, 344, and 348 in the layout blocks 320 and 340. To show the details, portions 327, 337, and 347 in dotted triangles of the layout blocks 320 and 340 in FIG. 6 are enlarged and illustrated in FIGS. 6A-6C.

In the embodiments depicted in FIGS. 6A and 6B, the method 200 proceeds to operation 206 if the evaluated distances $D_1$ and $D_2$ are less than a preset value D, where the extended device patterns 322, 326, 342, and 346 in the same line are further extended lengthwise and connected together to form connected device patterns. In the embodiments depicted in FIG. 6A, the extended device patterns 322 are further extended towards each other by a distance $D_4$. In some embodiments, both the adjacent extended device patterns 322 may be further extended towards each other from the adjacent ends facing each other, where a sum of the further extension of both the extended device patterns 322 equals to the distance $D_4$. Alternatively, one of the extended device patterns 322 may be extended from the end facing the other extended device patterns 322, while the other extended device pattern 322 may remain the same length.

In the embodiments depicted in FIG. 6B, the distance $D_2$ is less than the preset value D, where the adjacent device patterns 324 and 328 are separated by a distance $D_3$ between the ends of the extended device patterns 322 and 326. The adjacent extended device patterns 322 and 326 have different line widths $w_1$ and $w_2$, where $w_1$ is less than $w_2$. In this case, the extended device pattern 322 is further extended toward the device pattern 328 by a distance $D_5$, thereby connecting to the extended device pattern 326. In other words, the extended portion that bridge the distance $D_5$ carries the line width $w_1$ of the extended device patterns 322.

In the embodiments depicted in FIG. 6C, the distance $D_3$ between the extended device patterns 346 is greater than the preset value D, such that the distance $D_3$ is within the limitations of the conventional optical lithography technology. Therefore, the extended device patterns 346 are left separated and not necessary to be connected. In this case, the method 200 skips the operation 206 and proceeds to operation 208 directly.

At operation 208, referring to FIGS. 3 and 7, the method 200 adds extended dummy patterns (e.g., line patterns) 360 to the spaces outside the layout blocks 320 and 340. The extended dummy patterns 360 are configured to undergo the same processes as the device patterns 324, 328, 344, and 348, during which the extended dummy patterns 360 are transferred to a fin structure and subsequently cut (or shortened, trimmed) by using the cut pattern to form dummy fins. The dummy fins are used to, among other purposes, avoid empty spaces and improve the uniformity and/or pattern density for subsequent processes (e.g., chemical mechanical planarization (CMP) and/or etching processes). The dummy fins are subsequently removed after completing required processes for the device regions.

In the present embodiments, the extended dummy patterns 360 fills the empty spaces of the IC design layout 122 outside the layout block 320 and 340 and contacting the vertical edges (along Y direction) of the layout block 320 and 340. In other words, the extended dummy patterns 360 surrounds (or embeds) the layout blocks 320 and 340. In some embodiments, the horizontal edges (along X direction) of the layout blocks 320 and 340 may fall into spaces between adjacent extended dummy patterns 360 or within an extended dummy pattern 360. The extended dummy patterns 360 are disposed parallel to the device patterns 324, 328, 344, and 348 and lengthwise along X direction. The extended dummy patterns 360 have uniform line width $w_5$ and line pitches $p_4$. In the present embodiments, the line width $w_5$ is less than the line widths $w_1$, $w_2$, $w_3$, and $w_4$ of the device patterns 324, 328, 344, and 348, respectively. The line pitch $p_4$ is less than the line pitches $p_1$, $p_2$, and $p_3$.

Referring to FIGS. 7A and 7B, a portion 325 in dotted lines of the IC design layout 122 is enlarged to show the details. A distance $D_6$ and a corner to corner distance $D_2$ between the wider extended device pattern 322 and the narrower extended dummy patterns 360 are subject to the manufacture rules to be less than certain distances $C_1$ and $C_2$, respectively. In some embodiments, the distance $C_1$ differs from the distance $C_2$ (e.g., $C_1$ is less than $C_2$). In the present embodiments, the distance $C_1$ equals to the distance $C_2$. If the distances $D_6$ and $D_7$ are less than the distance $C_1$, the adjacent corners of the extended device patterns 322 and the extended dummy patterns 360 may inadvertently connected together by thin lines 329 as shown in FIG. 7B when transferring to the substrate due to the limitation of the lithography process. The undesirable thin lines 329 are easy to break off and shift to other portions of the substrate, thereby causing unwanted features over the substrate. The present disclosure provides a solution to address this issue, such as by inserting mandrel bar patterns 380 between the extended device patterns 322 and the extended dummy patterns 360.

At operation 210, referring FIGS. 3, 8, 9, and 9A-9D, the method 200 forms mandrel bar patterns 380 between the extended device patterns 322, 342, and 346 inside the layout blocks 320 and 340 and the extended dummy patterns 360 outside the layout blocks 320 and 340. A width $w_6$ and length $L_1$ defined by the mandrel bar pattern 380 are decided by the edges of the layout blocks 320 and/or 340 as well as dummy patterns 370 that are cut (or shortened, trimmed) from the extended dummy patterns 360.

Figure 8:
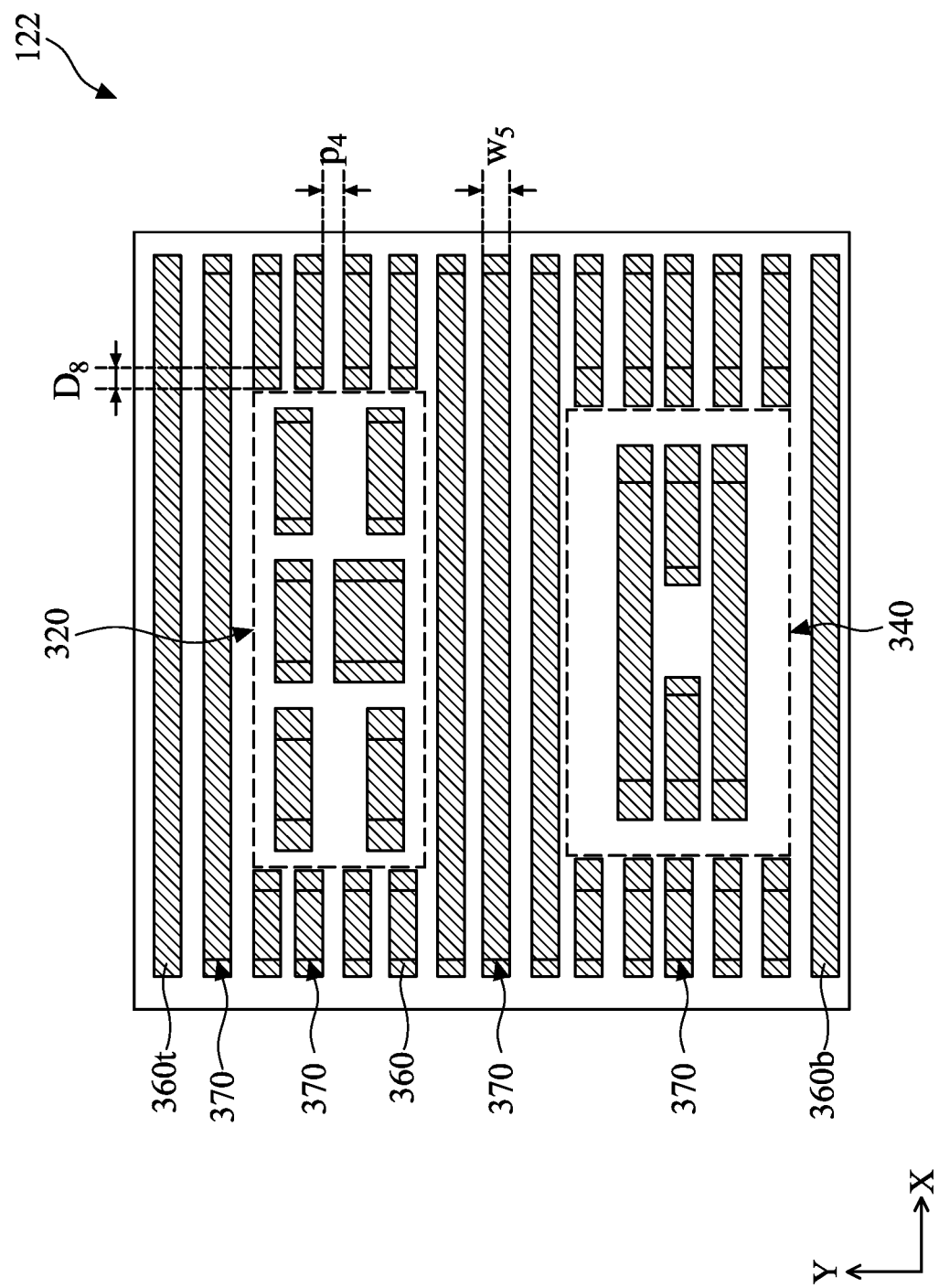

Referring to FIG. 8, the dummy patterns 370 are calculated and outlined by dotted rectangles. The dummy patterns 370 overlap with the extended dummy patterns 360, thereby sharing the same line width $w_5$ and line pitch $p_4$, but with shorter lengths. For example, the dummy patterns 370 are cut from the middle portions of the extended dummy patterns 360 to avoid the inadvertent rounding ends in the resulting fin structure. In other words, the end portions of the extended dummy patterns 360 that the rounding ends may happen are excluded (or cut) from the dummy patterns 370. The topmost and the bottommost extended dummy patterns 360t and 360b are excluded from the dummy patterns 370 due to the difficulties of forming dummy devices along edges of the IC design layout 122.

Figure 9:
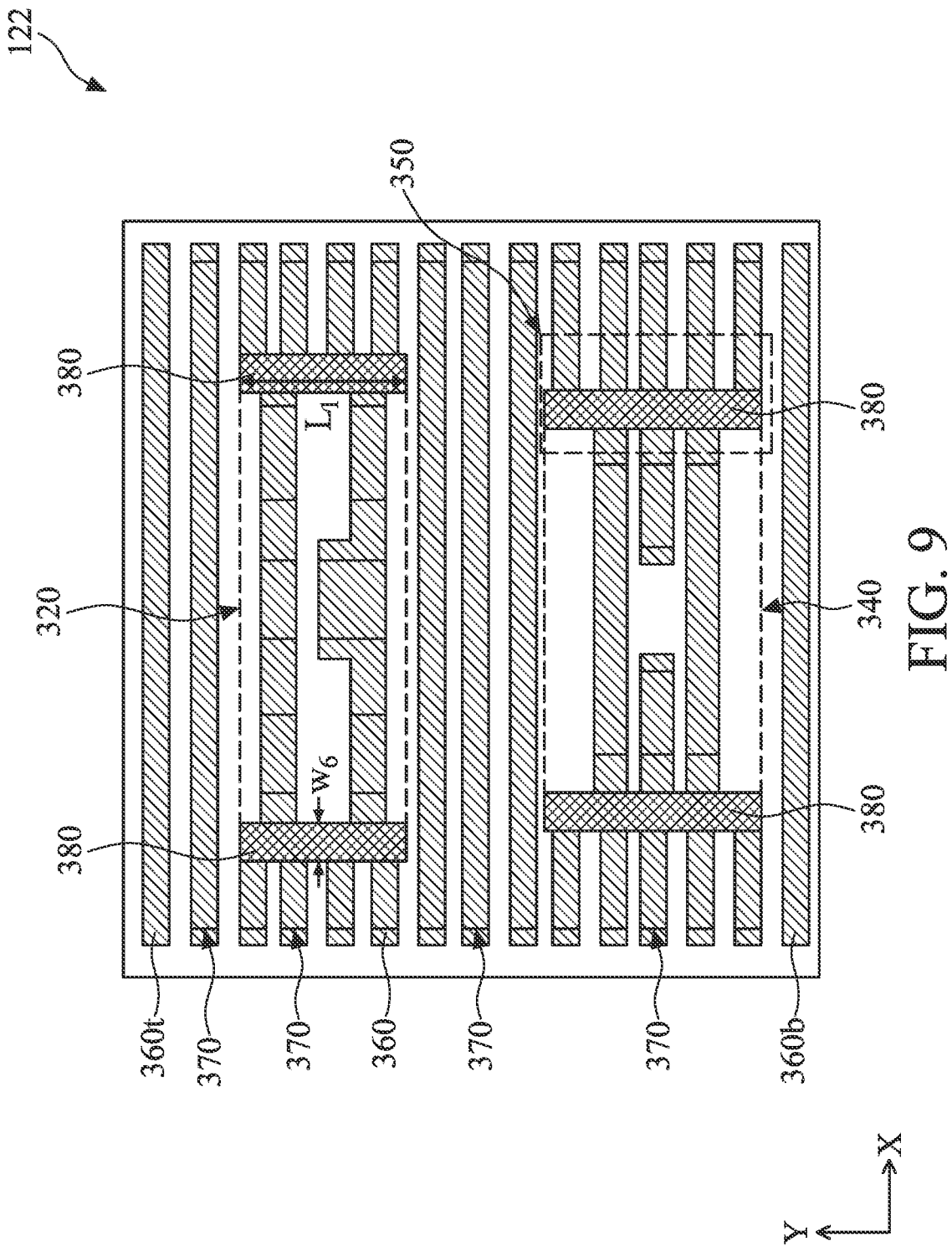
Figures 9A, 9B:
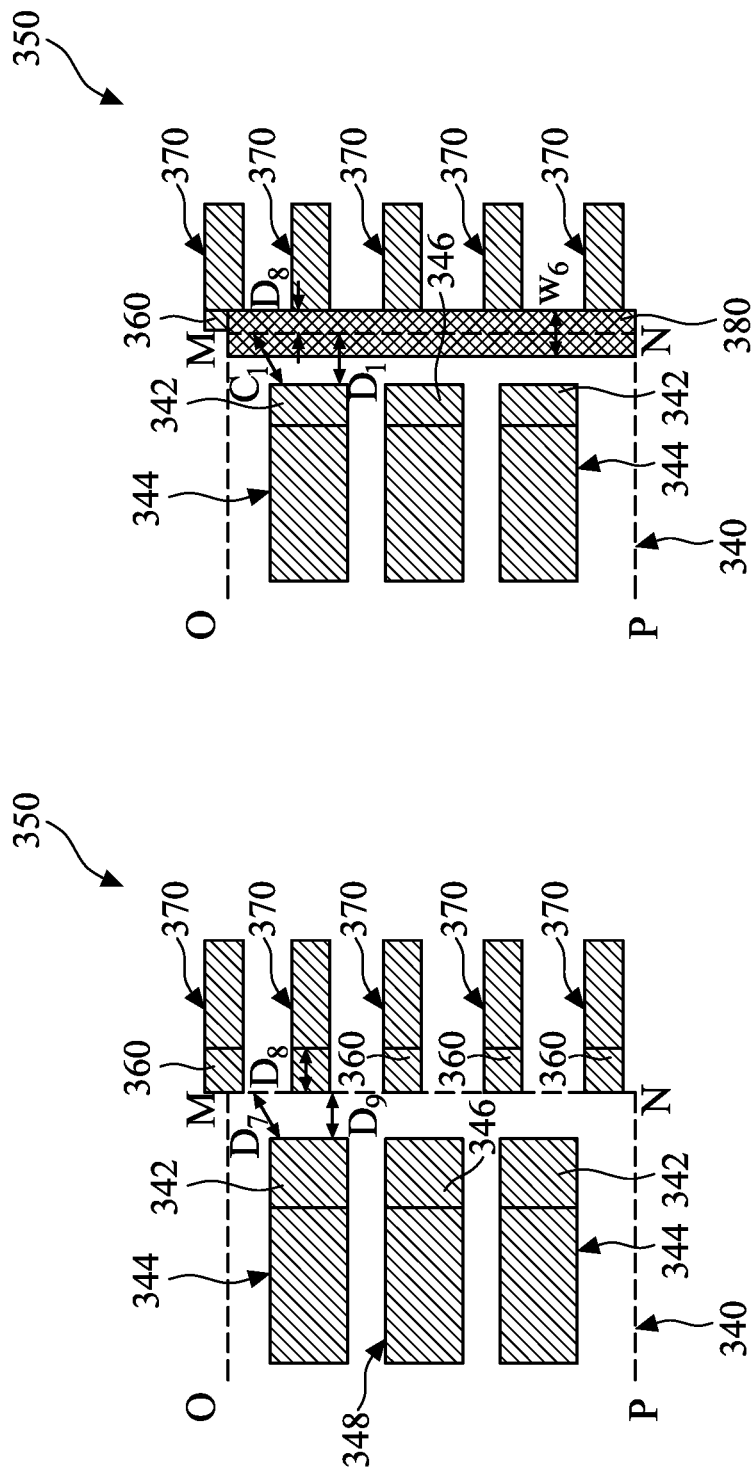

Thereafter, the method 200 inserts the mandrel bar patterns 380 between the extended device patterns 322, 342, and 346 inside the layout blocks 320 and 340 and the dummy patterns 370 outside the layout blocks 320 and 340, as depicted in FIG. 9. A portion 350 of FIG. 9 shown in dashed rectangle is enlarged and explained in details with respect to FIGS. 9A-9D. Referring to FIG. 9A, a vertical edge MN of the layout block 340 is vertically aligned with the extended dummy patterns 360 along Y direction, horizontally apart from the ends of the extended device patterns 342 and 346 by the distance $D_9$ along X direction, and horizontally apart from the ends of the dummy patterns 370 by a distance $D_8$ along X direction. In addition, a top end M of the vertical edge MN ends within a width of one extended dummy pattern 360, and a bottom end N of the vertical edge MN ends within a line pitch between two extended dummy patterns 360. In other words, the horizontal edges of the layout block 340 OM and PN are parallel to the extended dummy patterns 360 but not along the same line.

Referring to FIG. 9B, the method 200 insert a mandrel bar pattern 380 using the vertical edge MN as a center line of the mandrel bar pattern 380. The width $w_6$ of the mandrel bar pattern 380 is designed to be two times of the distance $D_8$. As such, a first edge of the mandrel bar pattern 380 meets (or aligns with) the ends of the dummy patterns 370. Thereafter, as depicted in FIG. 9C, the method 200 extend the ends of the extended device patterns 342 and 346 to reach a second edge of the mandrel bar pattern 380 opposite to the first edge. As such, the mandrel bar pattern 380 connects the extended device patterns 342 and 346 with the dummy patterns 370.

Figure 9D:
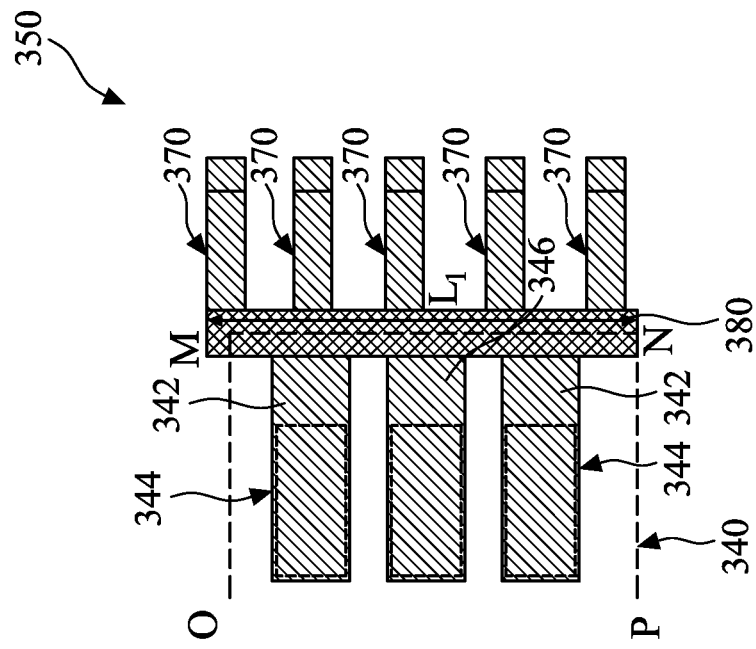
Figure 9C:
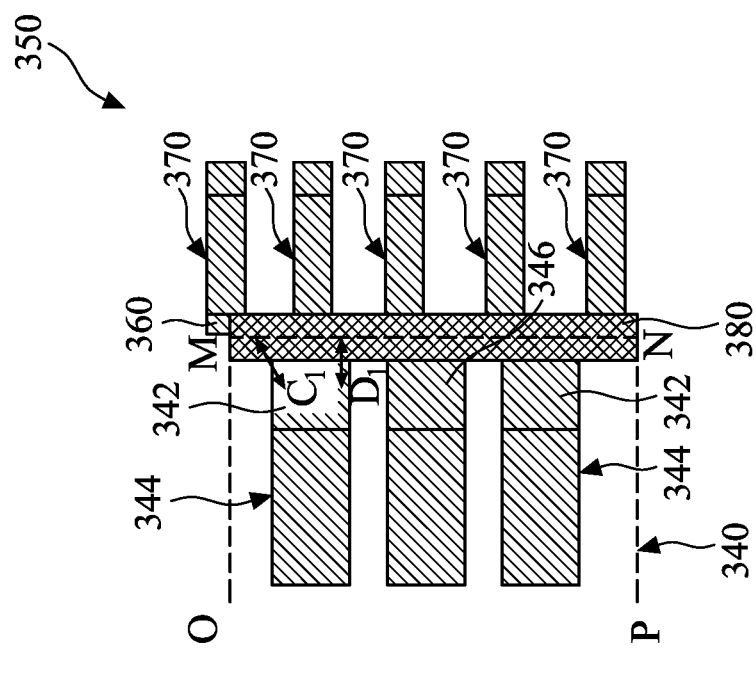

The method 200 then, referring to FIG. 9D, extends the length of the mandrel bar pattern 380 upwards, such that a top edge of the mandrel bar pattern 380 aligns with a top edge of the dummy pattern 370 where the mandrel bar pattern 380 connected thereto. Still referring to FIG. 9D, the method 200 further shortens the length of the mandrel bar pattern 380 from a bottom end, such that a lower edge of the mandrel bar pattern 380 aligns with a lower edge of the dummy patterns 370 where the mandrel bar pattern 380 connected thereto.

The embodiments of inserting the mandrel bar patterns 380 as depicted in the FIGS. 9A-9D provide benefits to prevent or reduce small spaces between line patterns, thereby avoiding space violations and the subsequent issues. One such issue is the forming of the undesirable thin lines that between ends of the line patterns after transferring to the substrate. The inadvertent thin lines may break and shift to other locations and causing process variations. In addition, the embodiments depicted in FIGS. 9A-9D, among others, minimize data points and calculation steps for simplified pattern layout generation.

At operation 212, referring to FIGS. 2 and 3, the method 200 outputs layout data for mask fabrication. In an embodiment, the layout data includes a mandrel pattern layout and a cut pattern layout. In the present embodiment, the mandrel pattern layout includes the extended device patterns 322, 326, 342, 346, the extended dummy patterns 360, and the mandrel bar patterns 380. The cut pattern includes the differences between the device patterns 324, 328, 344 and 348 and the extended device patterns 322, 326, 342, and 346 respectively, the differences between the dummy patterns 370 and the extended dummy patterns 360, the mandrel bar patterns 380, and the topmost and the bottommost extended dummy patterns 360t and 360b.

The mandrel pattern layout is used to pattern the substrate to form a mandrel structure. The mandrel structure is later subjected to a cutting process using a mask corresponding to the cut pattern layout, thereby removing portions of the mandrel structure (e.g., the rounding ends of the dummy mandrel lines 360m, rounding ends of device mandrel lines 322m, 326m, 342m, and 346m, the topmost and the bottommost dummy mandrel lines 360tm and 360bm, as well as the mandrel bar 380m as shown later in FIG. 12) to form a fin structure. The fin structure includes device fins corresponding to the device patterns 324, 328, 344 and 348 in the layout blocks 320 and 340, as well as the dummy fins corresponding to the dummy patterns 370 outside the layout blocks 320 and 340. The dummy fins are used to form dummy devices simultaneously with the formation of the devices from the device fins to adjust the pattern density and the device density for the subsequent processes, such as etching processes and CMP. In the present embodiments, a length of the end portion of the extended dummy patterns 360 is about 0.5 to about 1.5 times of a distance between gate stacks in the later formed devices. In one example, the end portion is about 22.5 nm to about 67.5 nm.

Further, each of the mandrel pattern layout and the cut pattern layout may also include certain assist features, such as those features for imaging effect, processing enhancement, and/or mask identification information. In some embodiments, operation 212 outputs the mandrel pattern layout and the cut pattern layout in a computer-readable format for subsequent fabrication stage. For example, the layouts may be outputted in GDSII, DFII, CIF, OASIS, or any other suitable file format.

Figure 10:
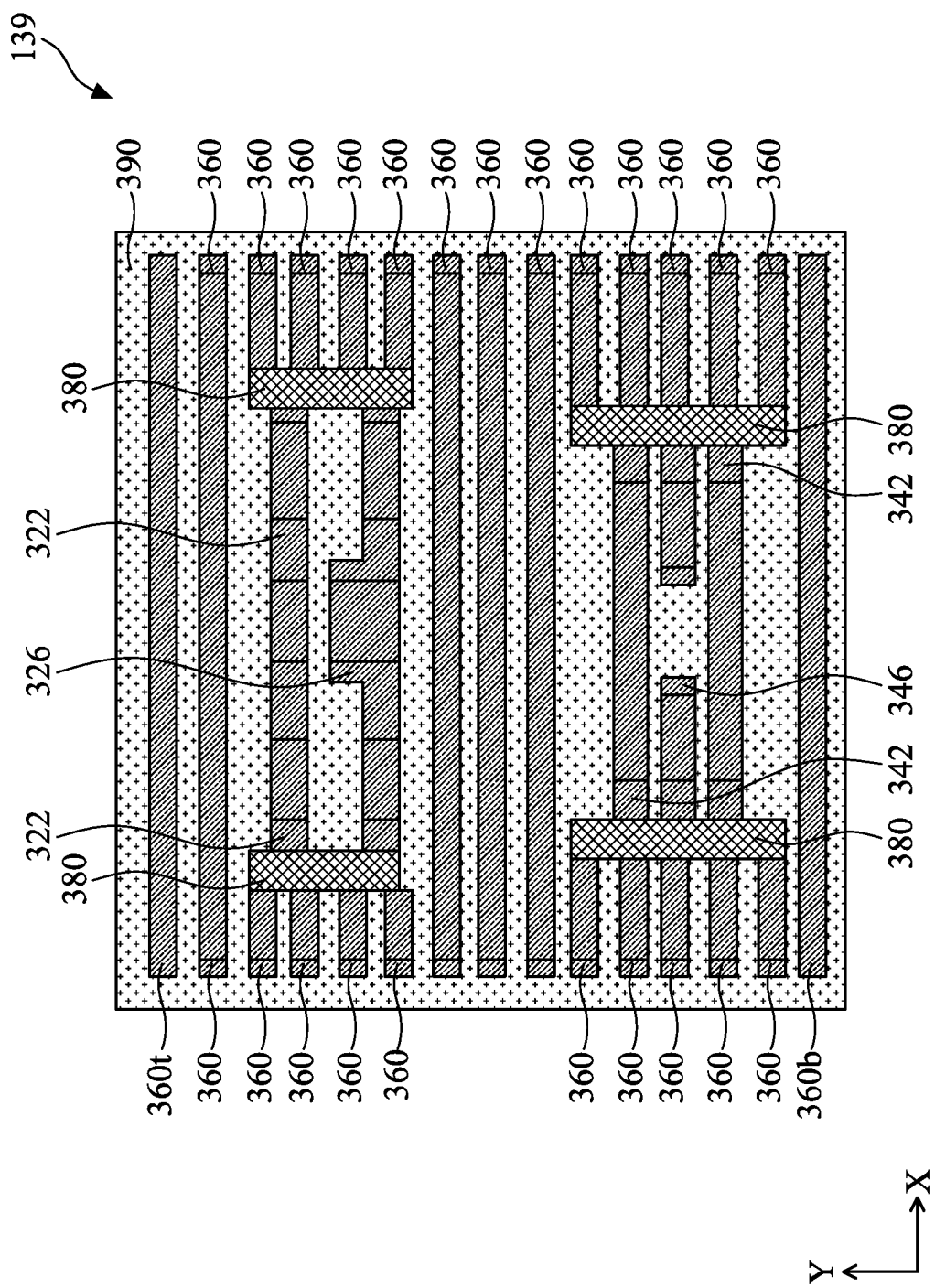
FIGS. 10 and 11 illustrate masks produced according to various aspects of present disclosure according to the method shown in FIG. 3.
Figure 11:
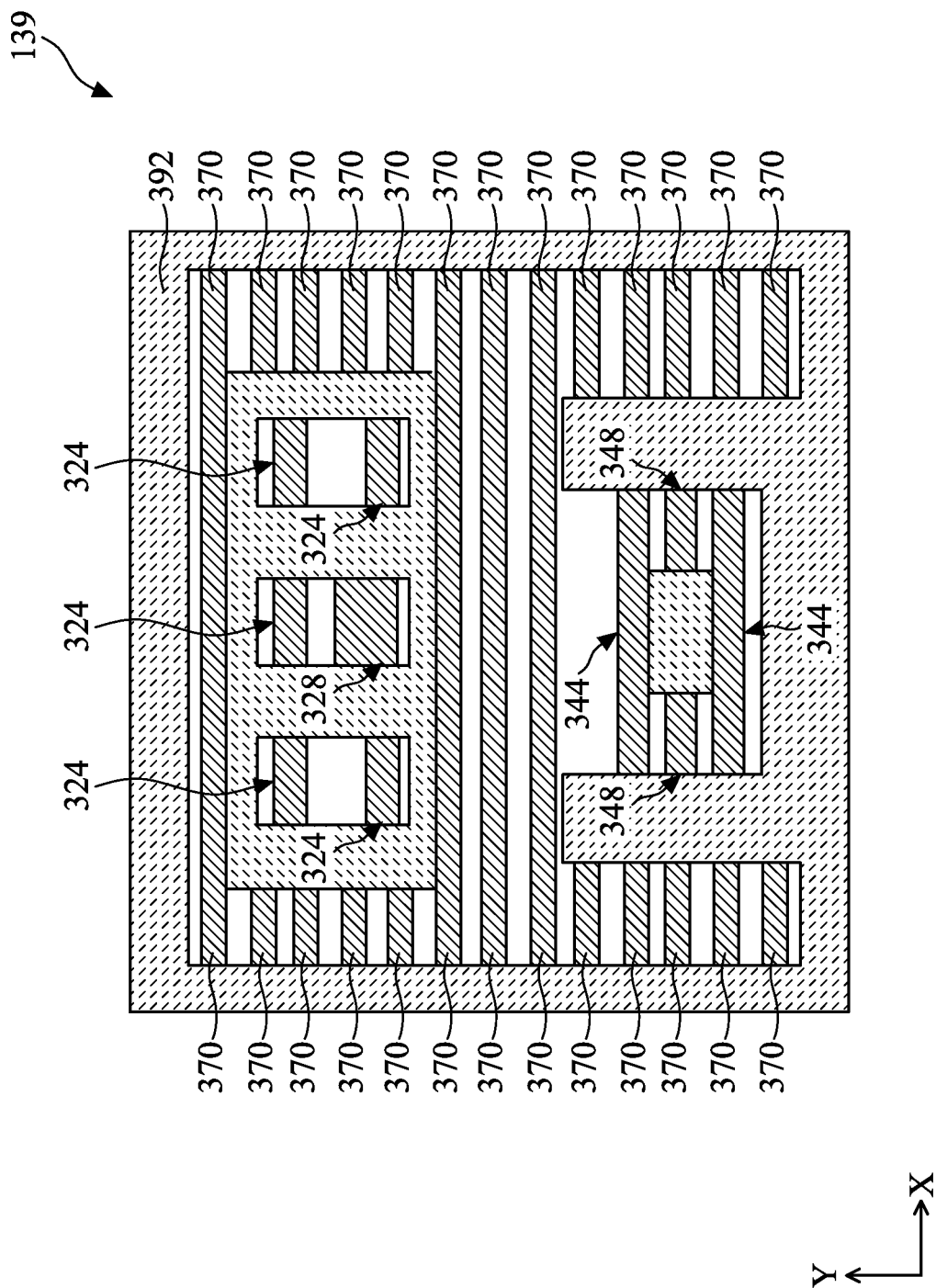

At operation 214, referring to FIGS. 3, 10, and 11, the method 200 manufactures a first mask 390 (FIG. 10) with the mandrel pattern layout and a second mask 392 (FIG. 11) with the cut pattern layout. Operation 214 may manufacture other masks for various layers and features of the IC 150. In some embodiments, the first mask and the second mask may be transmissive masks (e.g., for deep ultraviolet lithography) or reflective masks (e.g., for extreme ultraviolet lithography), and may include imaging enhancement features such as phase shifting. In embodiments where maskless lithography, such as e-beam direct writing, is used, operation 214 is bypassed or involves data preparation for the particular direct writer without fabricating an actual mask.

In the present embodiments, the first mask carries the mandrel pattern layout including the first line patterns 322, 326, 342, and 346 in the layout blocks 320 and 340 along X direction; the second line patterns 360 outside the layout block 320 and 340 along X direction; and the mandrel bars 380 disposed between and connecting the first line patterns 322, 326, 342, and 346 and the second line patterns 360 along Y direction perpendicular to X direction. The second mask 392 includes a first column along Y direction dividing the first line patterns 322, 326, 342, and 346 into device patterns 324, 328, 344, and 348, respectively; a second column along Y direction overlapping with the mandrel bar patterns 380m to cut the later formed mandrel bars; and a third column along Y direction overlapping with portions of the second line patterns 360 to trim possible round endings in later formed fin structure.

Figure 12:
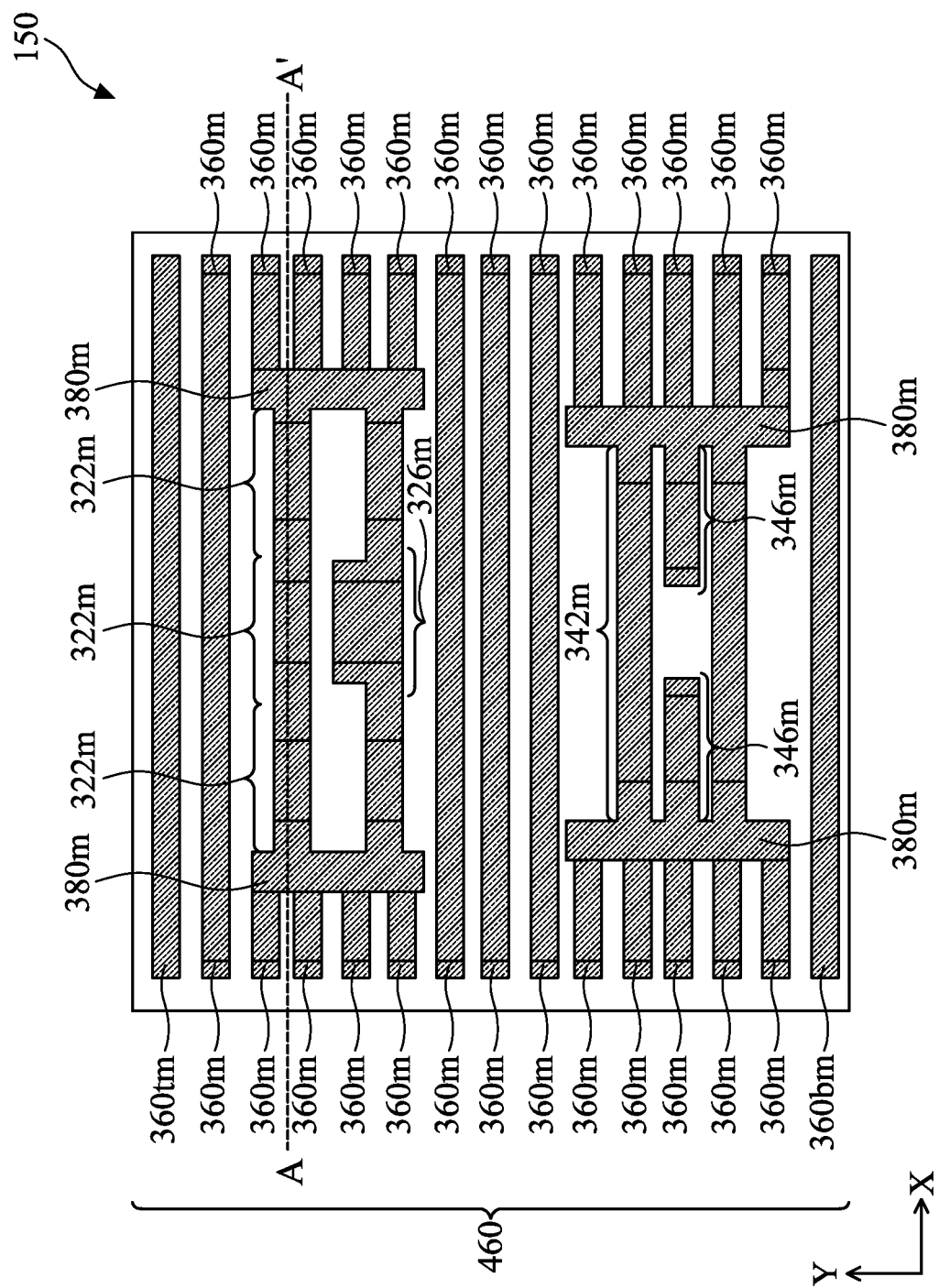
FIGS. 12, 12A, 12B, 13, 13A, 14, 14A, 14B, 15, and 15A illustrate top view or cross-sectional view of an IC in various manufacturing steps of the method shown in FIG. 3, according to various aspects of the present disclosure.
Figure 12A:
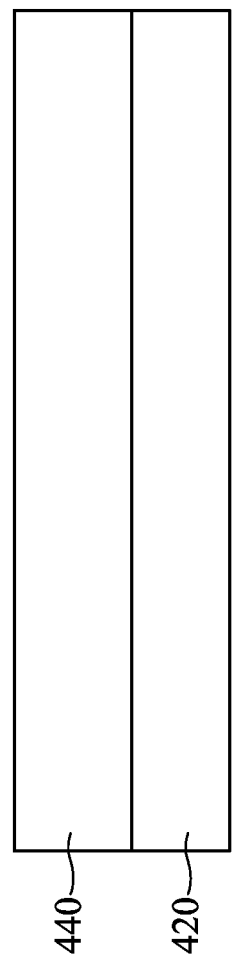
Figure 12B:
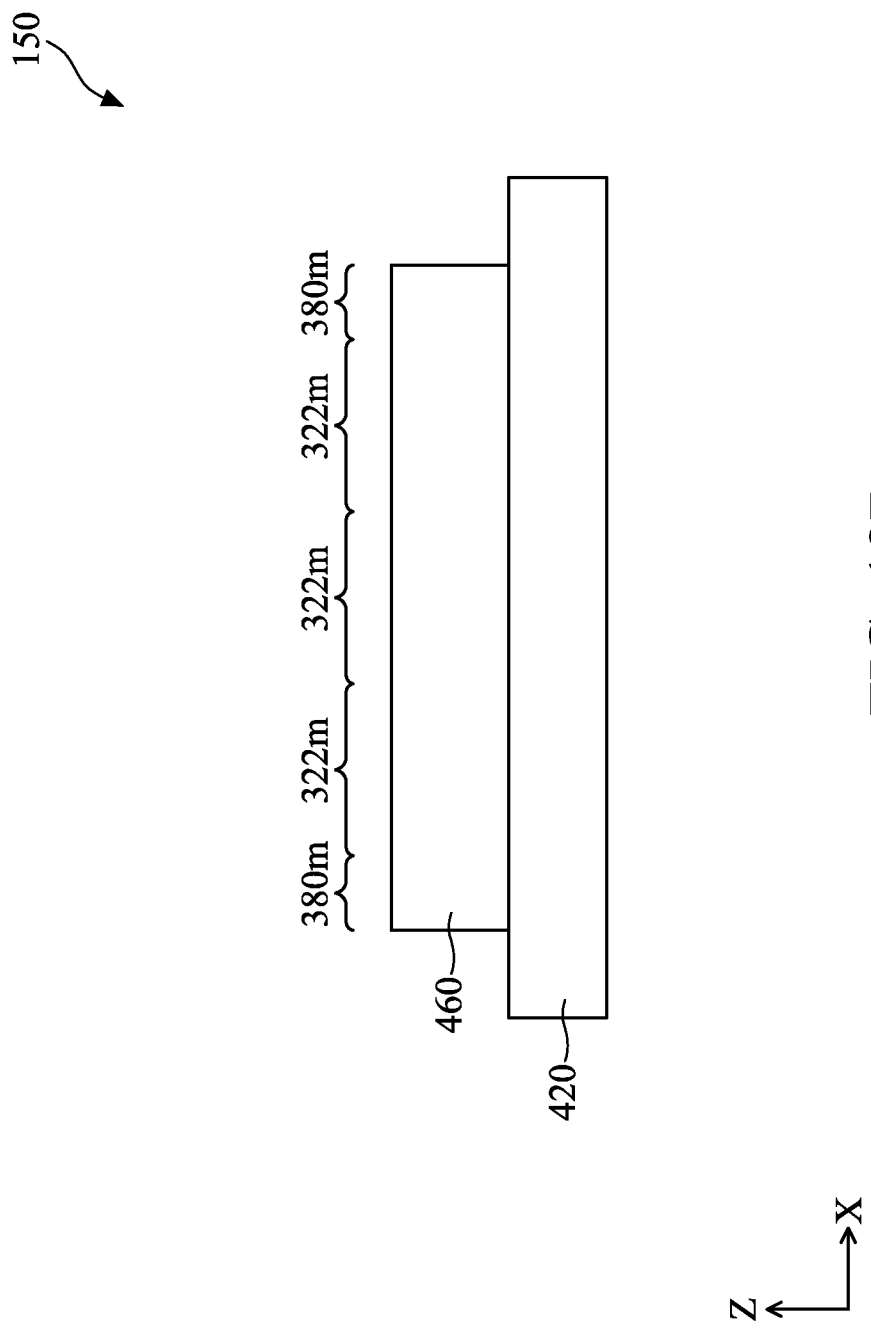

At operation 216, referring to FIGS. 3, 12 and 12A-B, the method 200 patterns a substrate 420 (such as a wafer) with the first mask 390 to fabricate a mandrel structure 460. The FIGS. 12A and 12B are cross-sectional views of the IC 150 at intermittent steps along line A-A'. The operation 216 involve one or more lithography patterning and etching steps. In various embodiments, operation 216 may pattern the substrate 420 with or without using a spacer technique. In the present embodiments, the mandrel structure is directly used to pattern the fin structure without using spacers. The operation 216 is merely an example for illustrating various aspects of the provided subject matter. Additional operations can be provided before, during, and after the operation 216, and some operations described can be replaced, eliminated, or moved around for additional embodiments of the method 200.

Prior to the pattering of the substrate 420, referring to FIG. 12A, a dielectric layer 440 is deposited over the substrate 420 (e.g., a semiconductor wafer). In various embodiments, the substrate 420 may include one or more elementary semiconductor, such as germanium; a compound semiconductor, such as silicon carbide, indium arsenide, or indium phosphide; or an alloy semiconductor, such as silicon germanium carbide, gallium arsenic phosphide, or gallium indium phosphide. The substrate 420 includes silicon in the present embodiment. Materials suitable for the dielectric layer 440 include, but not limited to, silicon oxide, silicon nitride, poly-silicon, $Si_3N_4$, SiON, TEOS, nitrogen-containing oxide, nitride oxide, high-k materials, or combinations thereof. The dielectric layer 440 may include multiple layers and may be formed by one or more deposition techniques, such as thermal oxidation, chemical vapor deposition (CVD), and physical vapor deposition (PVD).

Referring to FIGS. 12 and 12B, the method 200 then patterns the dielectric layer 440 to form a mandrel structure 460 over the substrate 420 using the first mask. The mandrel structure 460 includes multiple mandrel lines connected together as shown in FIG. 12: device mandrel lines 322m and 326m corresponds to the extended device patterns 322 and 326 in the layout block 320 (FIG. 9) respectively, device mandrel lines 342m and 346m correspond to the extended device patterns 342 and 346 in the layout block 340 (FIG. 9) respectively; dummy mandrel lines 360m corresponded to the extended dummy patterns 360 outside the layout blocks 320 and 340 (including the topmost and bottommost dummy mandrel lines 360tm and 360bm); and the mandrel bars 380m correspond to the mandrel bar patterns 380 that bridges the device mandrel lines 322m, 342m, and 346m with the adjacent dummy mandrel lines 360m. The device mandrel lines 322m, 326m, 342m, 346m, and the dummy mandrel lines 360m are oriented lengthwise along the X direction, while the mandrel bars 380m are each oriented lengthwise along a respective direction different from the X direction.

The mandrel structure 460 is formed by patterning the dielectric layer 440 with a procedure including a lithography process and an etching process. For example, a photoresist (or resist) layer (not shown) is formed on the dielectric layer 440 using a spin-coating process and soft baking process. Then, the photoresist layer is exposed to a radiation using the first mask manufactured in the operation 214. The exposed photoresist layer is developed using post-exposure baking, developing, and hard baking thereby forming a patterned photoresist layer over the dielectric layer 440. Subsequently, the dielectric layer 440 is etched through the openings of the patterned photoresist layer, forming the mandrel structure 460. The etching process may include a dry (or plasma) etching, a wet etching, or other suitable etching methods. The patterned photoresist layer is removed thereafter using a suitable process, such as wet stripping or plasma ashing. During the above photolithography process, the density and uniformity of the mandrel structure 460, including device mandrel lines 322m, 326m, 342m, 346m, dummy mandrel lines 360m, and mandrel bars 380m help improve pattern critical dimension uniformity in view of optical proximity effect.

Figure 13:
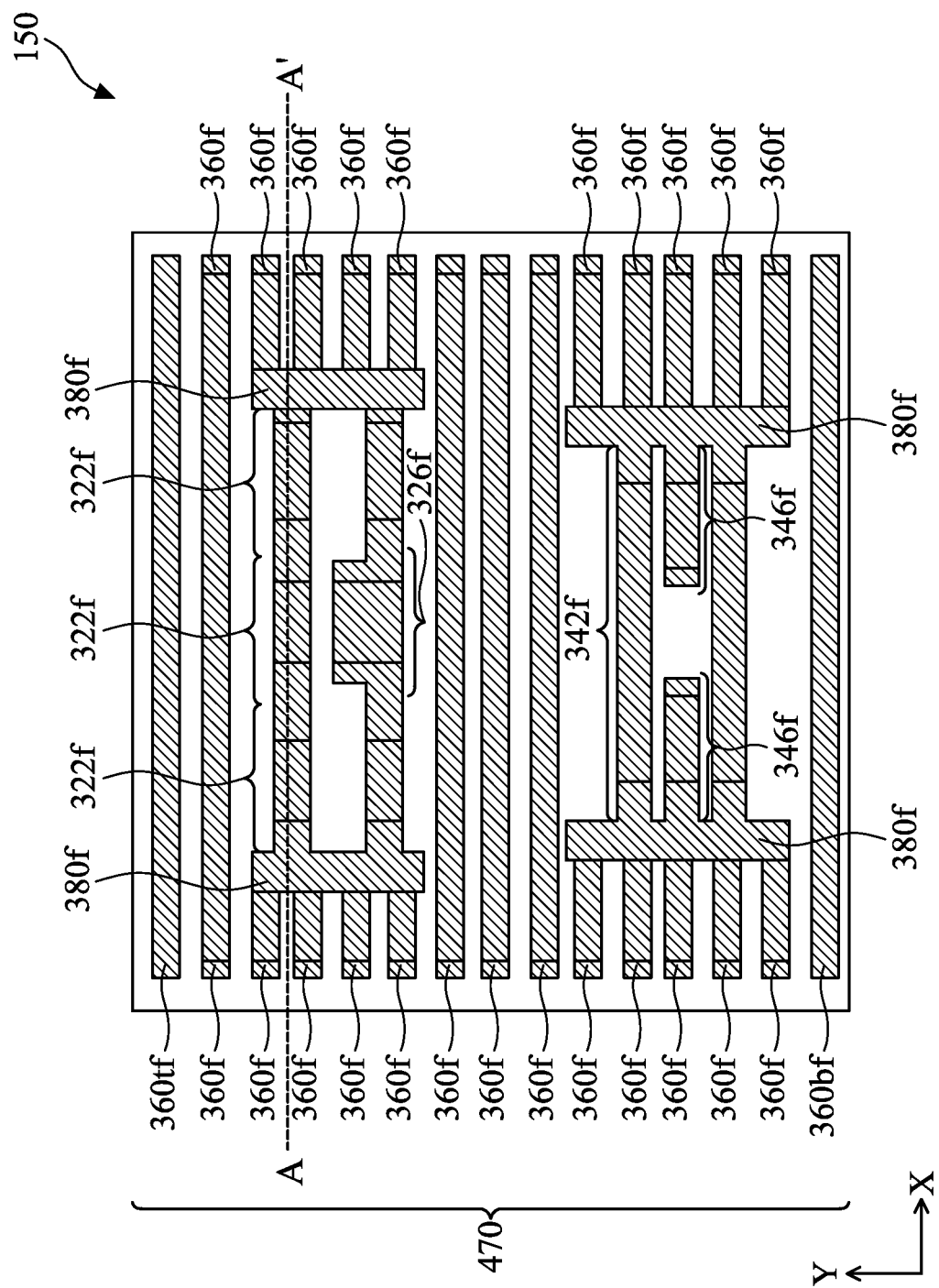
Figure 13A:
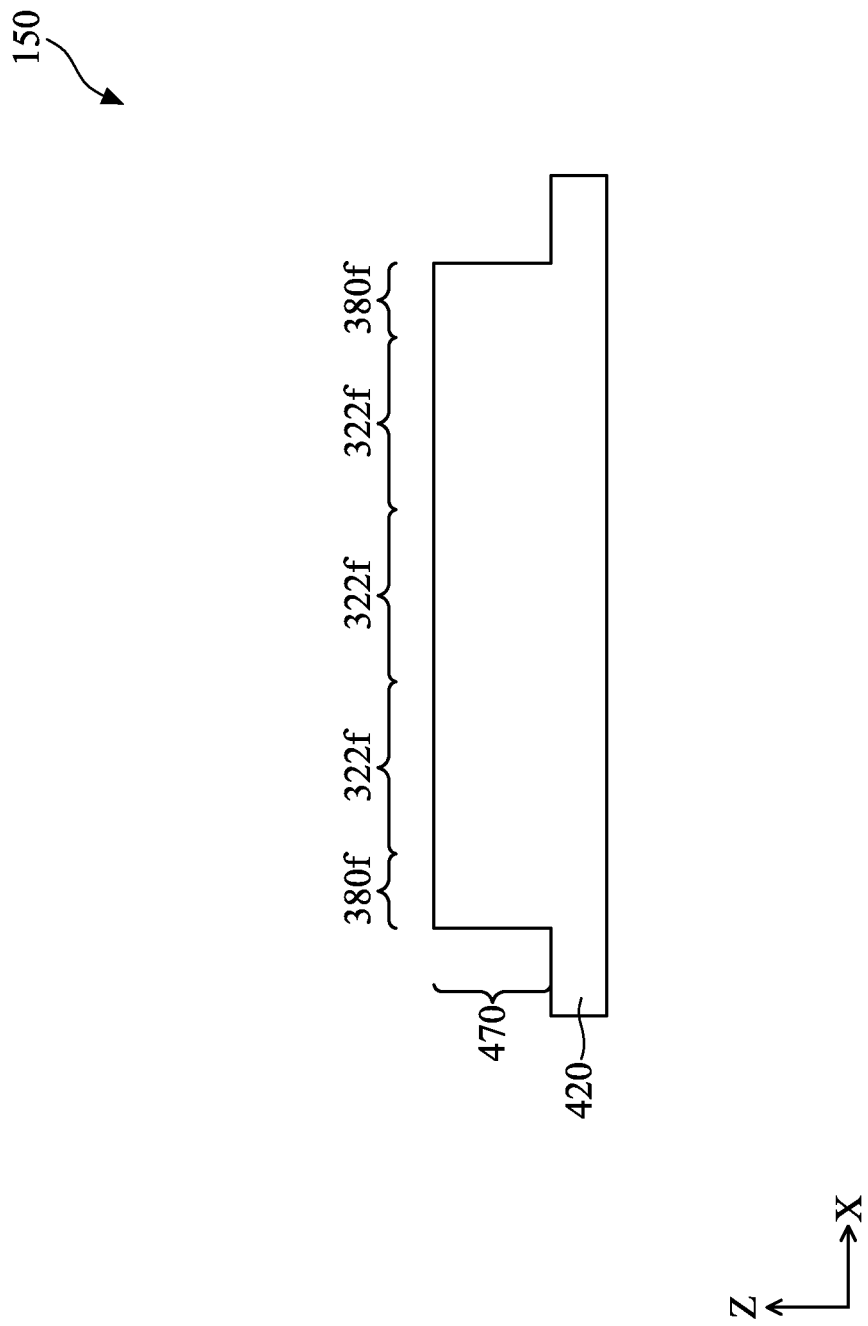

At operation 218, referring FIGS. 3, 13 and 13A, the method 200 etches the substrate 420 to form a fin structure 470 including multiple continuous fin lines in the substrate 420 using the mandrel structure 460 as an etch mask. The fin structure 470 carry the same patterns as the mandrel structure 460. In other words, the first mask 390, the mandrel structure 460, and the fin structure 470 have the same pattern. In the present embodiments, the continuous fin lines include device fin lines 322f, 326f, 342f, 346f corresponding to the device mandrel lines 322m, 326m, 342m, 346m; the dummy fin lines 360f corresponding to the dummy mandrel lines 360m; and the fin bars 380f corresponding to the mandrel bars 380m. The device fin lines 322f and 326f corresponding to the extended device patterns 322 and 326 in the same line are connected together similar as the device mandrel lines 322m and 326m in the mandrel structure 460. The device fin lines 322f and the device fin lines 342f and 346f are connected to the dummy fin lines 360f by the fin bars 380f corresponding to the mandrel bar patterns 380. The etching process can be a wet etching, a dry etching, or a combination thereof. The mandrel structure 460 is subsequently removed.

At operation 220, referring to FIGS. 3, 14 and 14A-14B, the method 200 performs a fin cut process with the second mask manufactured in the operation 214. The portions of the fin line covered by the cut patterns (cut regions) are substantially removed. In the present embodiment, the fin cut process includes a lithography process and an etching process. For example, a photoresist layer (not shown) is formed on the substrate 420 using a spin-coating process and soft baking process. Then, the photoresist layer is exposed to a radiation using the second mask manufactured in the operation 214. The exposed photoresist layer is subsequently developed and stripped thereby forming a patterned photoresist layer. The portions of the continuous fin lines corresponding to the extended portions of the extended device patterns 322, 326, 342, 346, 360 and the mandrel bar 380m are removed by the patterned photoresist layer. The portions of the continuous fin line corresponding to the device patterns 324, 328, 344, 348, and 370 are protected by the patterned photoresist layer. Subsequently, the continuous fin lines are etched through the openings of the patterned photoresist layer. The patterned photoresist layer is removed thereafter using a suitable process, such as wet stripping or plasma ashing. In an embodiment, the operation 220 may also remove the topmost and the bottommost dummy fin lines 360tf and 360bf. These two fin lines are close to the edge of the IC 150 and may not be uniform with other fin lines for subsequent processes, they are removed thereby for better uniformity to achieve better process control.

Figure 14:
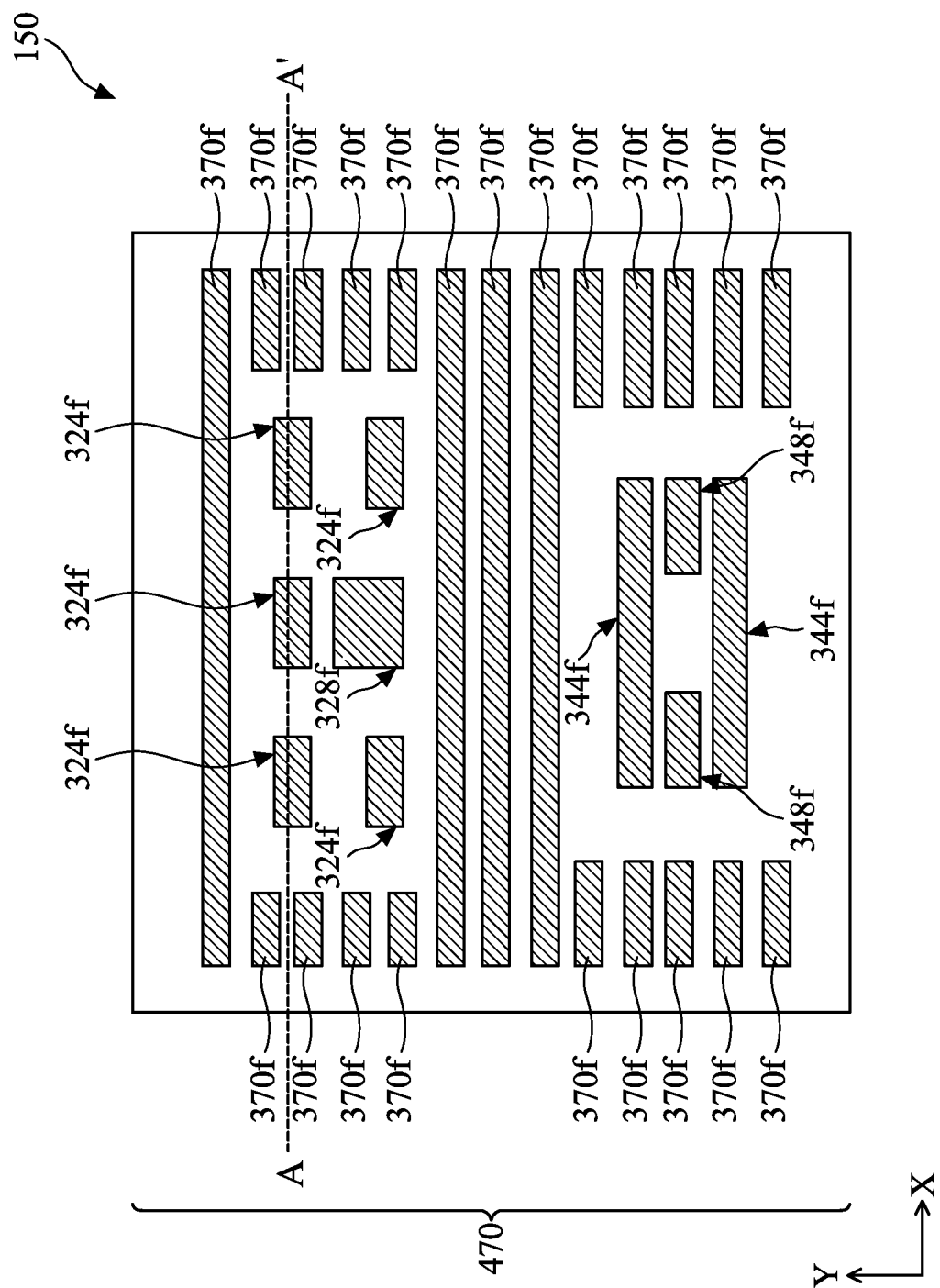
Figure 14A:
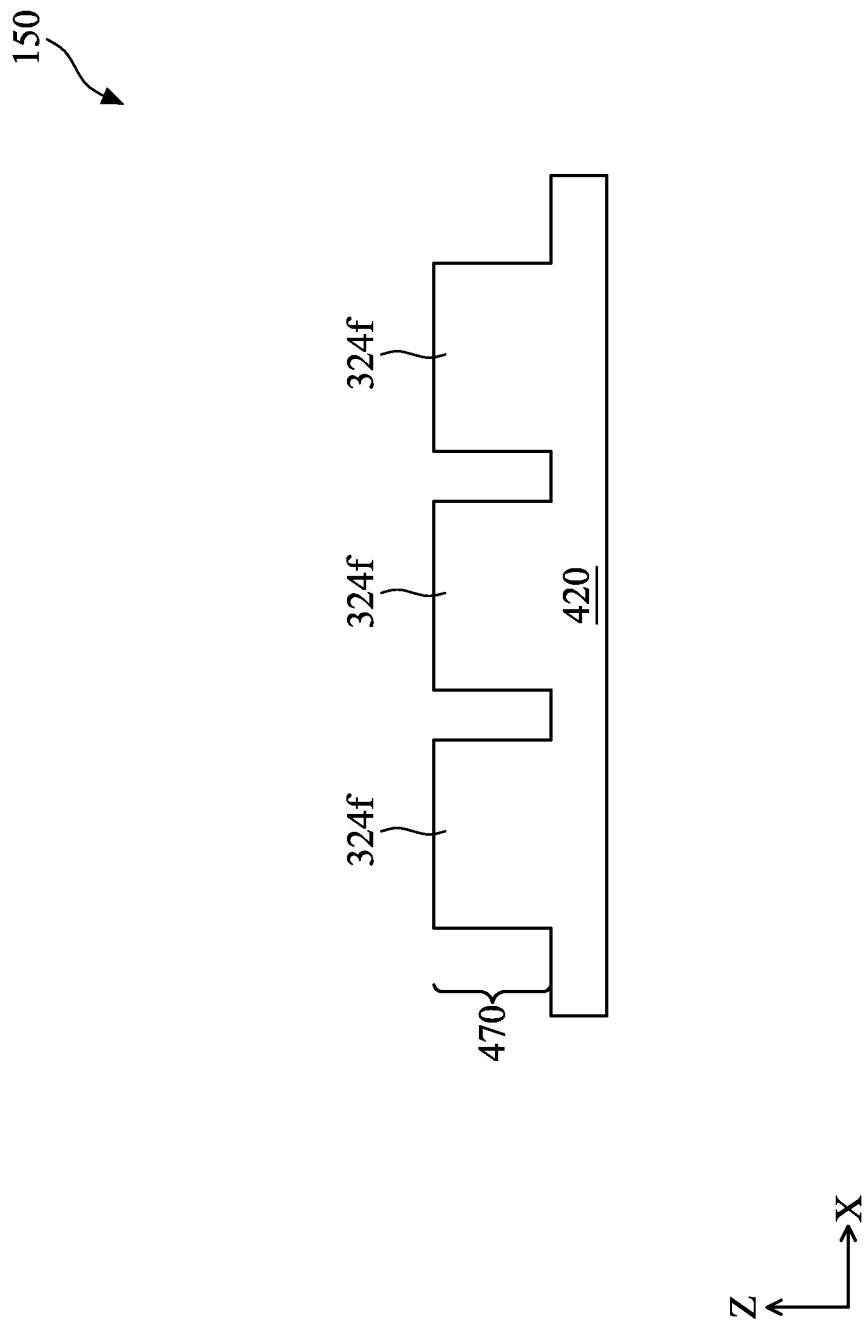
Figure 14B:
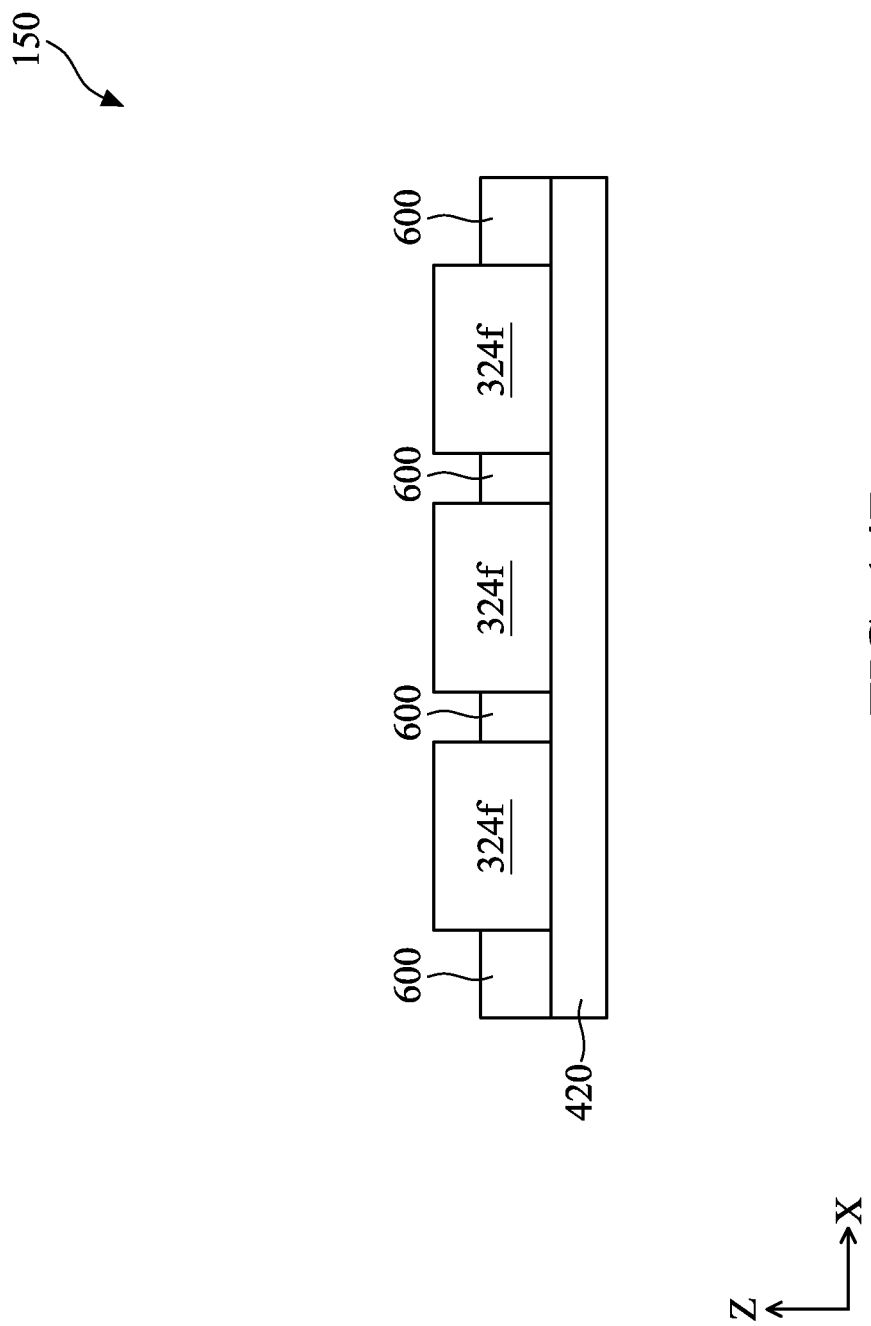
Figure 15:
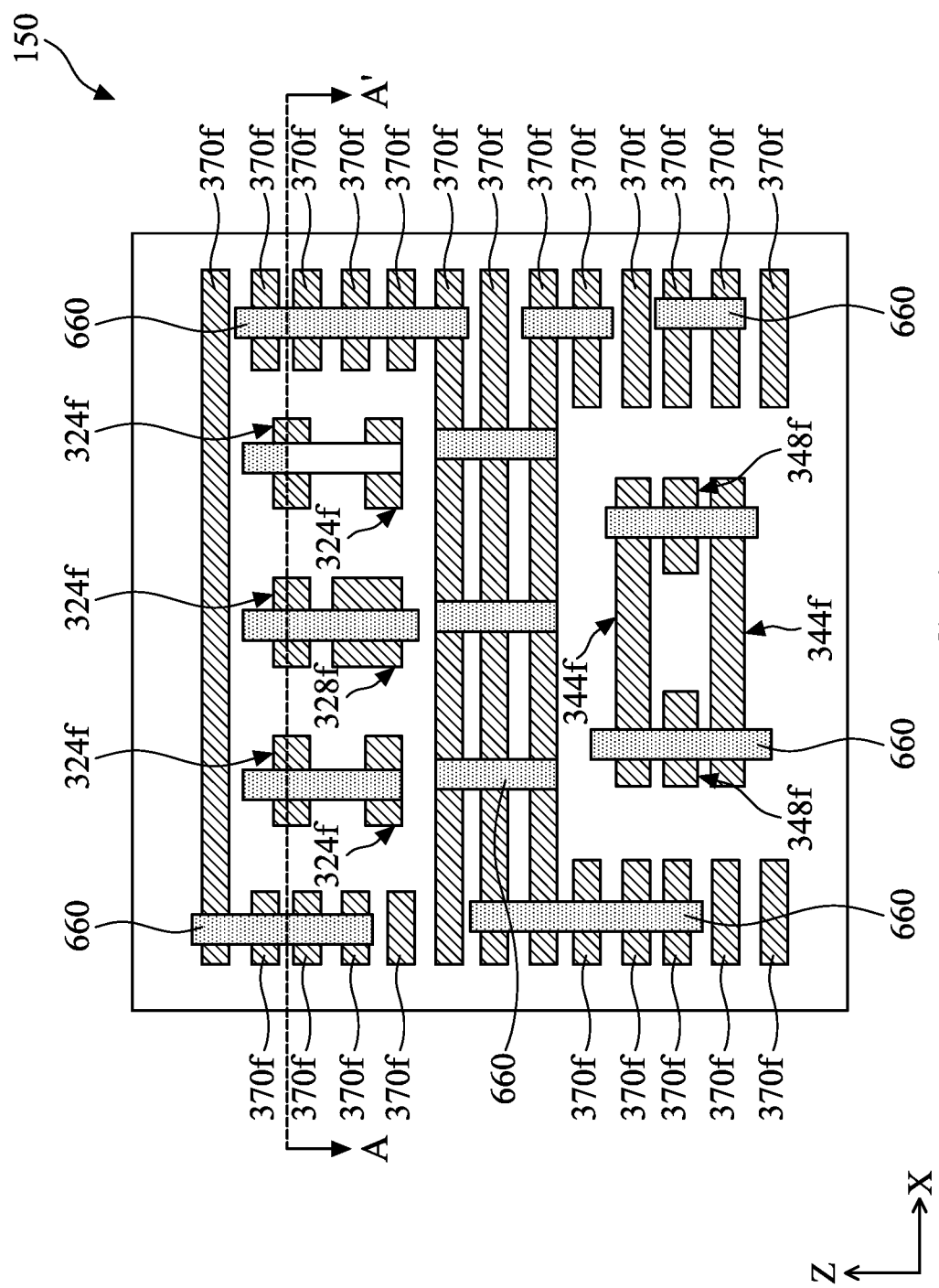
Figure 15A:
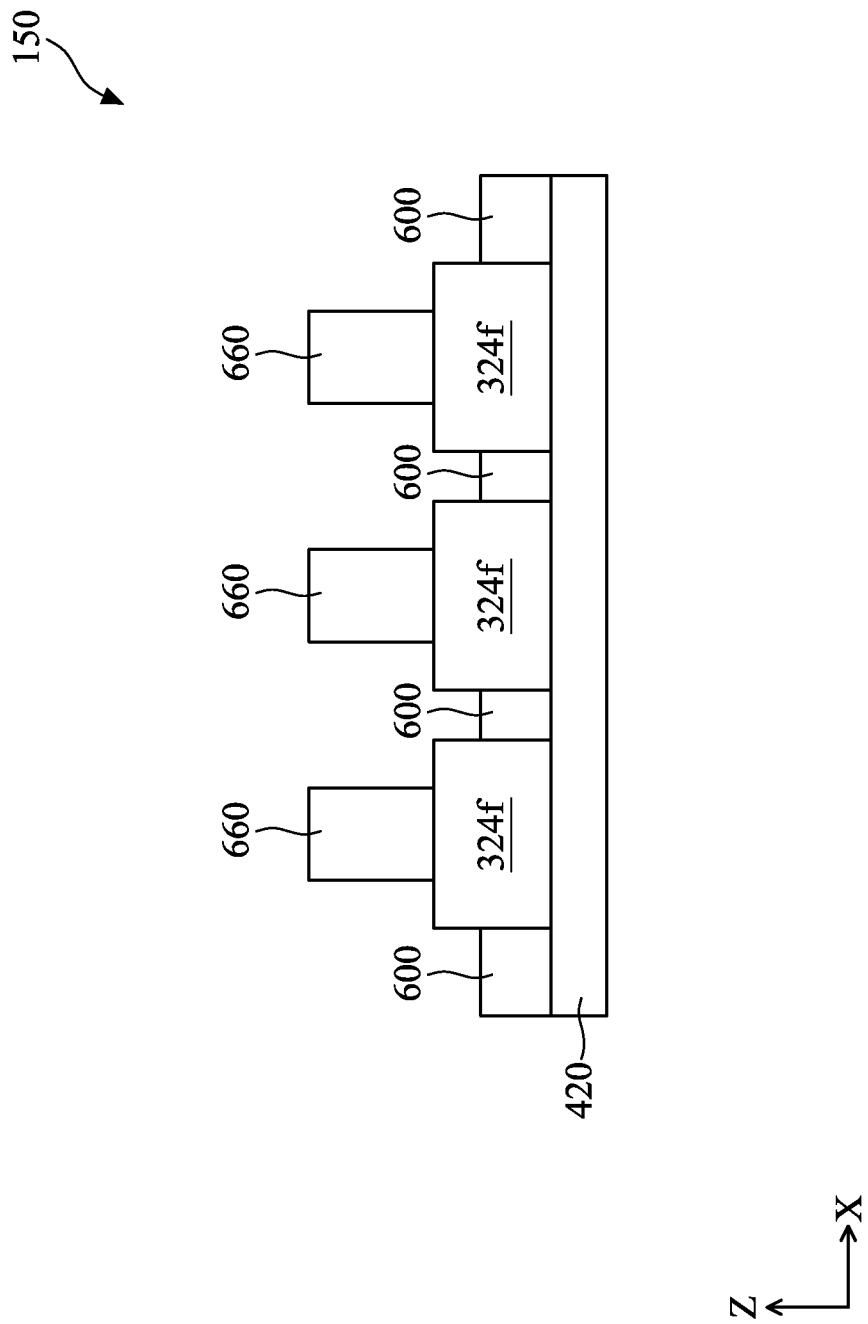

At operation 222, referring to FIGS. 3, 14B, 15, and 15A, the method 200 performs further processes to complete the fabrication of the final IC 150. For example, the operation 222 may form isolation structures 600 as shown in FIG. 14B. The isolation feature 600 electrically isolate the various fins, including the device fins 324f, 328f, 344f, and 348f, as well as the dummy fins 370f. In an embodiment, operation 222 forms the isolation feature 600 by depositing a dielectric material such as silicon oxide over the substrate 420 and then etches back the dielectric material. In the present embodiment, portions of the device fins 324f, 328f, 344f, and 348f protruding above the isolation feature 600 provide source, drain, and channel regions for FinFETs. The dummy fins 370f undergo the same processes as the device fins 324f, 328f, 344f, and 348f to achieve better device density and process uniformity.

The operation 222 may also form gate stacks 660 over the device fins (e.g., 324f, 328f, 344f, and 348f) and dummy fins (e.g., 370f) using a gate-first process or a gate-last process. Thereafter, the operation 222 may form source and drain regions (not shown) in the fins using ion implantation, epitaxial growth, and/or other suitable methods. Other processes include forming source and drain contacts, forming gate contacts, and forming via and metal interconnects, and so on.

Although not intended to be limiting, the present disclosure provides many benefits to the manufacturing of an IC. For example, the present disclosure includes a method of avoiding space violations between line patterns in an IC pattern layout, especially space violations between corners of adjacent line patterns with different line widths (corner to corner violation). In some embodiments, the device patterns are positioned inside the layout blocks, and dummy patterns having different line width than the device patterns are inserted outside the layout blocks. The IC pattern layout further includes mandrel bar patterns connecting the device patterns and the dummy patterns to avoid corner to corner violation, where the mandrel bar patterns are disposed lengthwise in a direction perpendicular with the lengthwise direction of the device pattern. In some embodiments, the device patterns disposed within a user defined minimum distance are connected together into one pattern line. In some embodiments, dummy devices are formed over the dummy fins to improve fin uniformity, fin critical dimension, and CMP loading effect during various stages of fin etching processes.

In one aspect, the present disclosure provides a method that includes receiving an integrated circuit (IC) design layout including a layout block, where the layout block includes first line patterns disposed along a first direction, extending lengths of the first line patterns, connecting portions of the first line patterns disposed within a distance less than a preset value, forming second line patterns disposed outside the layout block parallel to the first line patterns, forming mandrel bar patterns overlapping edges of the layout block, where the mandrel bar patterns orients along a second direction perpendicular to the first direction, and outputting a pattern layout for mask fabricating, where the pattern layout includes the layout block, the first and second line patterns, and the mandrel bar patterns.

In another aspect, the present disclosure provides a method that includes receiving an integrated circuit (IC) design layout including a layout block, where the layout block includes first line patterns oriented lengthwise in a first direction. The method then extends lengths of the first line patterns along the first direction, adds second line patterns oriented lengthwise in the first direction surrounding the layout block, adds mandrel bar patterns along boarders of the layout block, where the adding of the mandrel bar patterns includes calculating positions of dummy pattern positions within the second line patterns, forming the mandrel bar patterns using the boarders of the layout block as center lines, where the mandrel bar patterns orients lengthwise in a second direction perpendicular to the first direction, and where the mandrel bar patterns contacts the dummy patterns. The method further includes extending first line patterns to contact the mandrel bar patterns and outputting a pattern layout in a computer-readable format, where the pattern layout includes the layout block, the first and second line patterns, and the mandrel bar patterns. Thereafter, the method fabricates a mask using the pattern layout.

In yet another aspect, the present disclosure provides a method of forming a semiconductor structure that includes providing a semiconductor substrate, forming a mandrel structure over the semiconductor substrate using a first mask, where the first mask includes first line patterns in a layout block along a first direction, second line patterns outside the layout block along the first direction, and mandrel bars disposed between the first line patterns and the second line patterns along a second direction perpendicular to the first direction. The method further includes performing a cutting process using a second mask over the mandrel structure to form a fin structure, where the second mask includes a first column along the second direction dividing the first line patterns into device patterns, a second column along the second direction overlapping with the mandrel bars, and a third column along the second direction overlapping with portions of the second line patterns. Thereafter, the method forms gates over the fin structure along the second direction.

The foregoing outlines features of several embodiments so that those having ordinary skill in the art may better understand the aspects of the present disclosure. Those having ordinary skill in the art should appreciate that they may readily use the present disclosure as a basis for designing or modifying other processes and structures for carrying out the same purposes and/or achieving the same advantages of the embodiments introduced herein. Those having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving an integrated circuit (IC) design layout including a layout block, the layout block including first line patterns disposed along a first direction;
    extending lengths of the first line patterns;
    connecting portions of the first line patterns disposed within a distance less than a preset value;
    forming second line patterns disposed outside the layout block parallel to the first line patterns;
    forming mandrel bar patterns overlapping edges of the layout block, the mandrel bar patterns oriented along a second direction perpendicular to the first direction; and
    outputting a pattern layout for mask fabricating, wherein the pattern layout includes the layout block, the first and second line patterns, and the mandrel bar patterns.

2. The method of claim 1, wherein the connecting of the first line patterns includes:
    calculating distances between the first line patterns;
    selecting portions of the first line patterns to form a third line patterns, the third line patterns being spaced apart along the first direction by a distance less than the preset value; and
    extending lengths of the third line patterns disposed in the same line to form connected third line patterns.

3. The method of claim 1, wherein the first line patterns are spaced apart from the second line patterns, and the mandrel bar patterns are bridging the first and the second line patterns.

4. The method of claim 1, wherein the forming of the mandrel bar patterns includes:
    calculating dummy pattern within the second line patterns;
    inserting the mandrel bar patterns along the edges of the layout block, the mandrel bar patterns contacting ends of the dummy patterns; and
    extending the lengths of the first line patterns adjacent to the mandrel bar patterns, the extended first line patterns contacting the mandrel bar patterns.

5. The method of claim 1, wherein the first line patterns include patterns having different line widths, and the line widths being wider than line widths of the second line patterns.

6. The method of claim 1, wherein the layout block is free of the second line patterns.

7. The method of claim 1, wherein the second line patterns include a uniform line width and a uniform line pitch outside the layout block.

8. A method of forming a pattern layout, comprising:
    receiving an integrated circuit (IC) design layout including a layout block, the layout block including first line patterns oriented lengthwise in a first direction;
    extending lengths of the first line patterns along the first direction;
    adding second line patterns oriented lengthwise in the first direction surrounding the layout block;
    adding mandrel bar patterns along boarders of the layout block, the adding of the mandrel bar patterns including:
        calculating positions of dummy pattern positions within the second line patterns;
        forming the mandrel bar patterns using the boarders of the layout block as center lines, the mandrel bar patterns oriented lengthwise in a second direction perpendicular to the first direction, and the mandrel bar patterns contacting the dummy patterns;
        extending first line patterns to contact the mandrel bar patterns; and
    outputting a pattern layout in a computer-readable format, wherein the pattern layout includes the layout block, the first and second line patterns, and the mandrel bar patterns; and
    fabricating a mask using the pattern layout.

9. The method of claim 8, further comprising:
    calculating distances between the first line patterns along the first direction;
    selecting the first line patterns disposed closer than a preset value to form third line patterns; and
    extending lengths of the third line patterns, thereby connecting adjacent third line patterns.

10. The method of claim 8, wherein the first line patterns include patterns with different line widths and line pitches, and wherein the line widths and the line pitches are different from line widths and line pitches of the second line patterns, respectively.

11. The method of claim 8, wherein the second line patterns include a uniform line width and a uniform line pitch outside the layout block.

12. The method of claim 8, wherein the first line patterns and the second line patterns are separated by a space, and the mandrel bar patterns fill the space to bridge the first line patterns and the second line patterns.

13. The method of claim 12, wherein the mandrel bar patterns have widths along the first direction that are less than a preset value.

14. A method of forming a semiconductor structure, comprising:
    providing a semiconductor substrate;
    forming a mandrel structure over the semiconductor substrate using a first mask, the first mask including:
        first line patterns in a layout block along a first direction;
        second line patterns outside the layout block along the first direction;
        mandrel bars disposed between the first line patterns and the second line patterns along a second direction perpendicular to the first direction;

performing a cutting process using a second mask over the mandrel structure to form a fin structure, the second mask including:
- a first column along the second direction dividing the first line patterns into device patterns;
- a second column along the second direction overlapping with the mandrel bars; and
- a third column along the second direction overlapping with portions of the second line patterns; and forming gates over the fin structure along the second direction.

15. The method of claim 14, wherein the mandrel bars connect the first and the second line patterns, and the mandrel bars include a width less than a preset value along the first direction.

16. The method of claim 14, wherein the second line patterns include a uniform line width less than line widths of the first line patterns, and the second line patterns include a uniform line pitch less than line pitches of the first line patterns.

17. The method of claim 14, wherein the layout block is free of the second line patterns.

18. The method of claim 14, wherein the second mask is used to remove mandrel bars formed by using the first mask.

19. The method of claim 14, wherein the fin structure has fin lines are shorter than corresponding mandrel lines in the mandrel structure.

20. The method of claim 14, wherein a number of fin lines in the fin structure is less than a number of mandrel lines in the mandrel structure.

\* \* \* \* \*